(12) United States Patent
Nakamura et al.

(10) Patent No.: US 12,476,192 B2
(45) Date of Patent: Nov. 18, 2025

(54) THREE-DIMENSIONAL MEMORY DEVICE INCLUDING A DRAIN CONTACT ETCH-STOP DIELECTRIC LAYER AND METHODS FOR FORMING THE SAME

(71) Applicant: SANDISK TECHNOLOGIES LLC, Addison, TX (US)

(72) Inventors: Ryo Nakamura, Yokkaichi (JP); Naohiro Hosoda, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 677 days.

(21) Appl. No.: 17/873,476

(22) Filed: Jul. 26, 2022

(65) Prior Publication Data
US 2024/0038667 A1   Feb. 1, 2024

(51) Int. Cl.
*H01L 23/535* (2006.01)
*H10B 41/27* (2023.01)
*H10B 43/27* (2023.01)

(52) U.S. Cl.
CPC .......... *H01L 23/535* (2013.01); *H10B 41/27* (2023.02); *H10B 43/27* (2023.02)

(58) Field of Classification Search
CPC ....... H01L 23/535; H10B 41/27; H10B 43/27; H10B 43/50
See application file for complete search history.

(56) References Cited

U.S. PATENT DOCUMENTS 10,312,139 B2 * 6/2019 Tsai ................... H01L 23/5226
10,468,413 B2   11/2019 Takuma et al.
10,818,545 B2   10/2020 Shimabukuro et al.
11,011,209 B2   5/2021  Kim et al.
11,251,191 B2   2/2022  Weng et al.
11,296,101 B2 * 4/2022  Lee ......................... G11C 5/025
11,664,237 B2 * 5/2023  Huang .................. H01L 23/528
                                                                257/774
11,856,765 B2 * 12/2023 Matsuno ................ H10B 43/27
(Continued)

FOREIGN PATENT DOCUMENTS

CN            112219278 A   *  1/2021   ........ H01L 27/11519

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Ratisha Mehta
*Assistant Examiner* — Adam Joseph Mott
(74) *Attorney, Agent, or Firm* — THE MARBURY LAW GROUP PLLC

(57) ABSTRACT

A three-dimensional memory device includes an alternating stack of insulating layers and electrically conductive layers, a composite insulating cap layer located over the alternating stack, memory openings vertically extending through the composite insulating cap layer and the alternating stack, and memory opening fill structures located in the memory openings. Each of the memory opening fill structures includes a vertical semiconductor channel and a vertical stack of memory elements. The composite insulating layer includes a bottom insulating cap layer, a top insulating cap layer, and an etch-stop dielectric layer located between the bottom insulating cap layer and the top insulating cap layer.

20 Claims, 29 Drawing Sheets

(56) References Cited

U.S. PATENT DOCUMENTS

| | | | |
|---|---|---|---|
| 2013/0082393 A1* | 4/2013 | Kawamura | H01L 21/76897 |
| | | | 257/773 |
| 2017/0125340 A1* | 5/2017 | Tsai | H01L 21/02178 |
| 2019/0267391 A1* | 8/2019 | Imai | H10B 43/50 |
| 2020/0051995 A1* | 2/2020 | Tanaka | H10B 43/35 |
| 2020/0058673 A1* | 2/2020 | Nishikawa | H10B 43/40 |
| 2021/0005617 A1* | 1/2021 | Kai | H10B 43/50 |
| 2021/0020566 A1* | 1/2021 | Zhu | H10B 43/35 |
| 2021/0159167 A1* | 5/2021 | Tsutsumi | H10B 41/10 |
| 2021/0287988 A1* | 9/2021 | Xie | H01L 21/76852 |
| 2021/0358803 A1* | 11/2021 | Lee | H01L 21/76829 |
| 2022/0059462 A1 | 2/2022 | Said et al. | |
| 2023/0061128 A1* | 3/2023 | Yang | H10B 43/50 |
| 2023/0135172 A1* | 5/2023 | Wang | H10D 84/038 |
| | | | 438/396 |
| 2023/0328973 A1* | 10/2023 | Said | H10B 41/35 |
| | | | 257/314 |

OTHER PUBLICATIONS

U.S. Appl. No. 17/345,315, filed Jun. 11, 2021, Sandisk Technologies LLC.
U.S. Appl. No. 17/509,323, filed Oct. 25, 2021, Sandisk Technologies LLC.
U.S. Appl. No. 17/566,262, filed Dec. 30, 2021, Sandisk Technologies LLC.
U.S. Appl. No. 17/716,698, filed Apr. 8, 2022, Sandisk Technologies LLC.

* cited by examiner

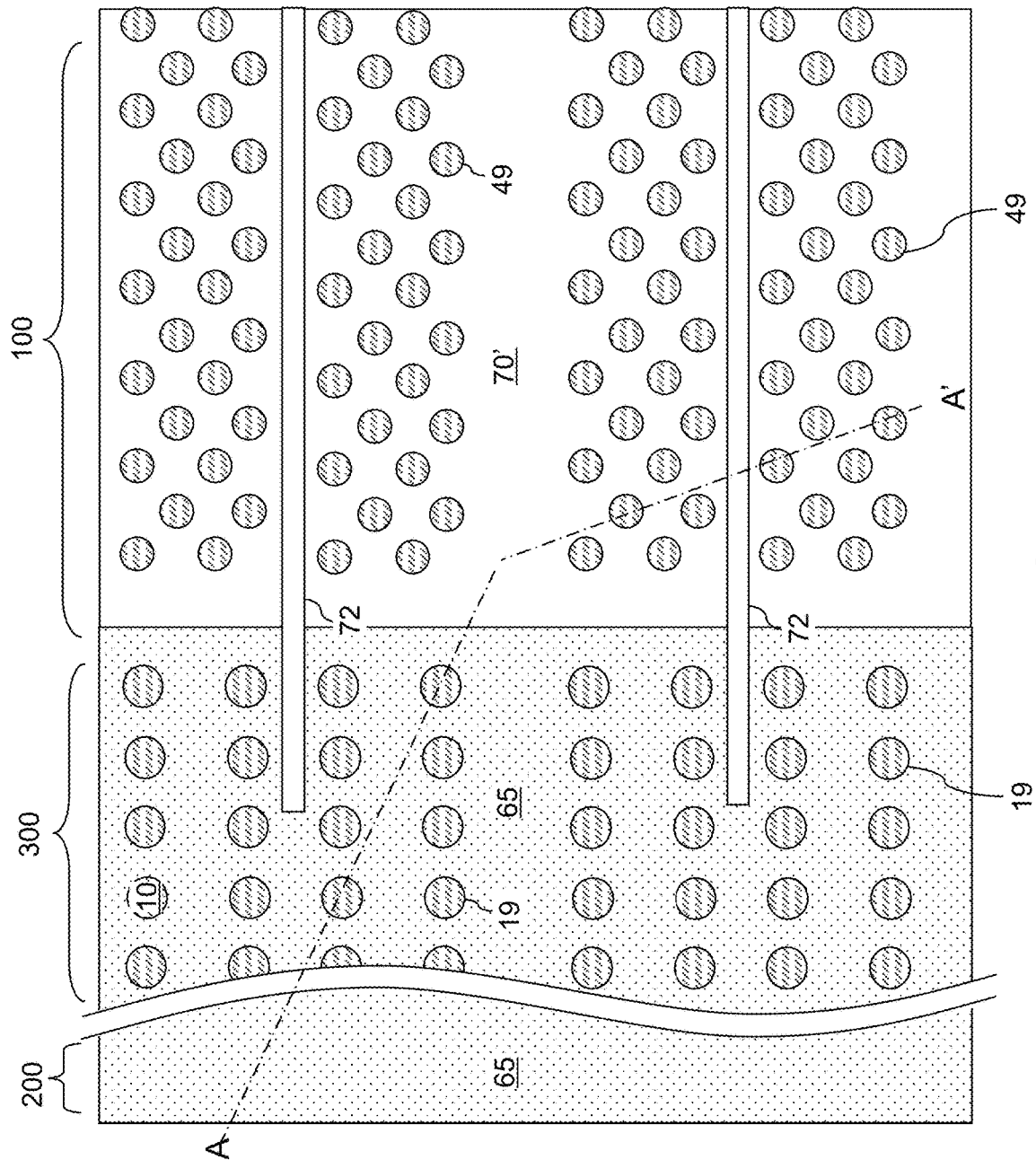

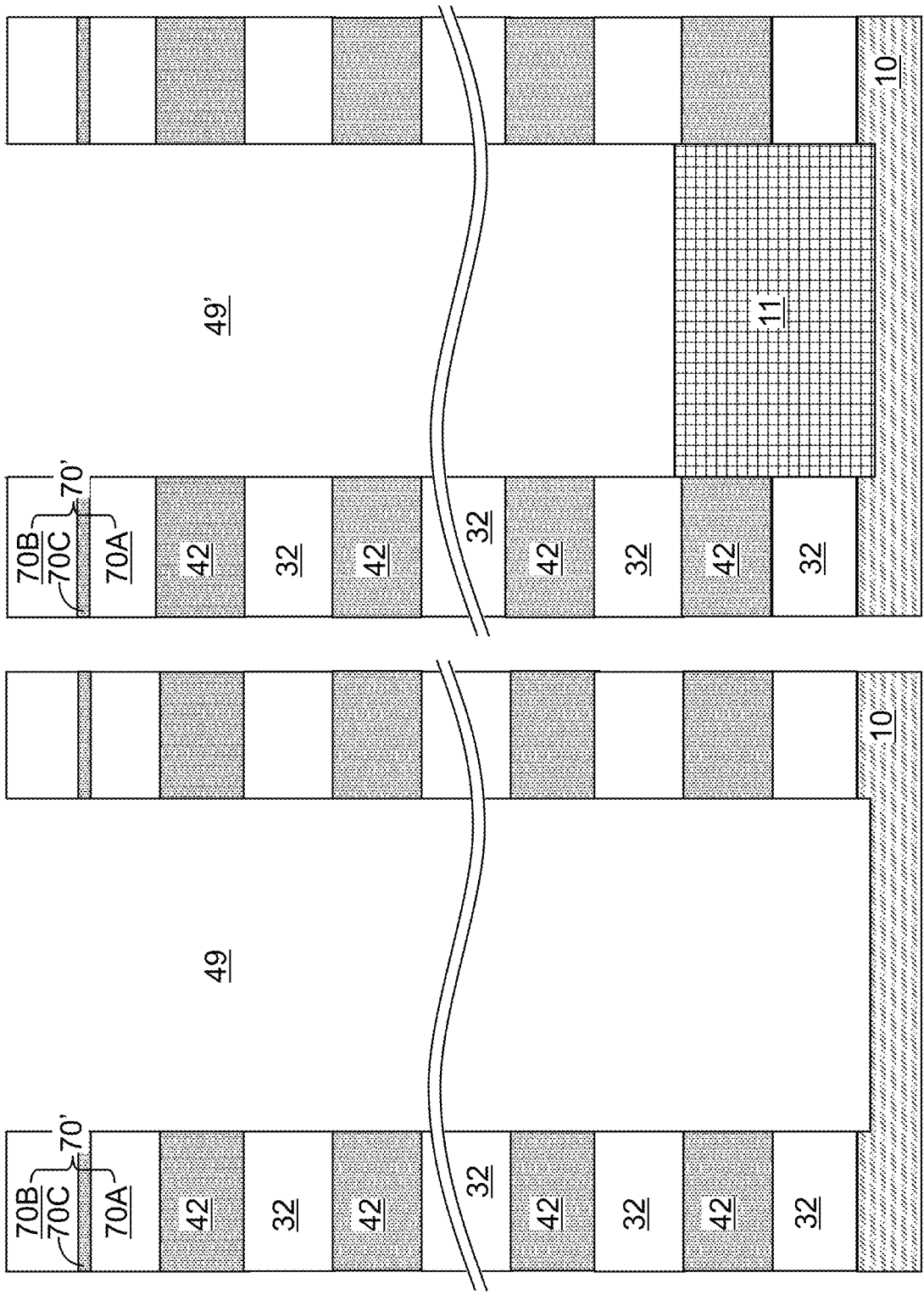

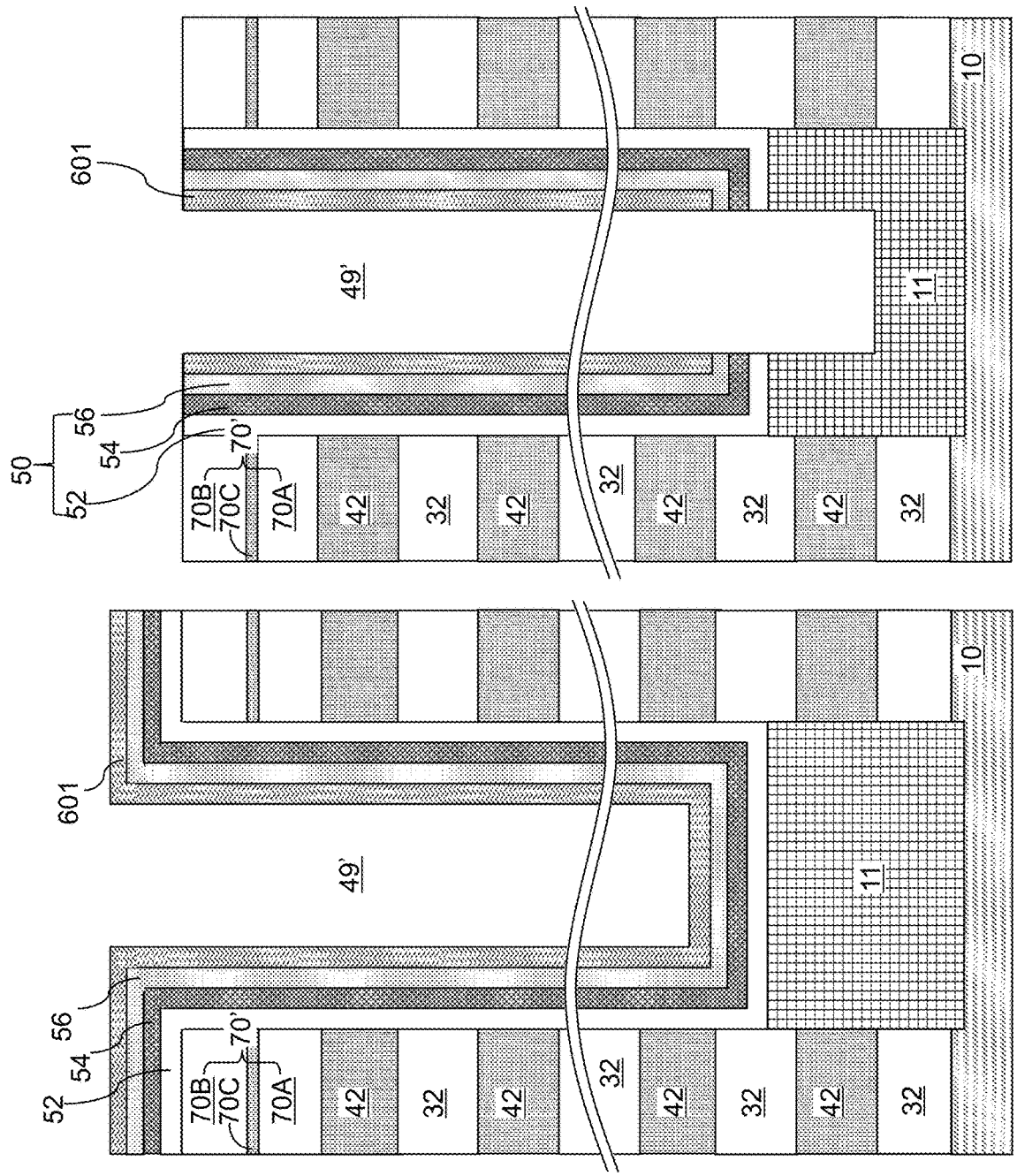

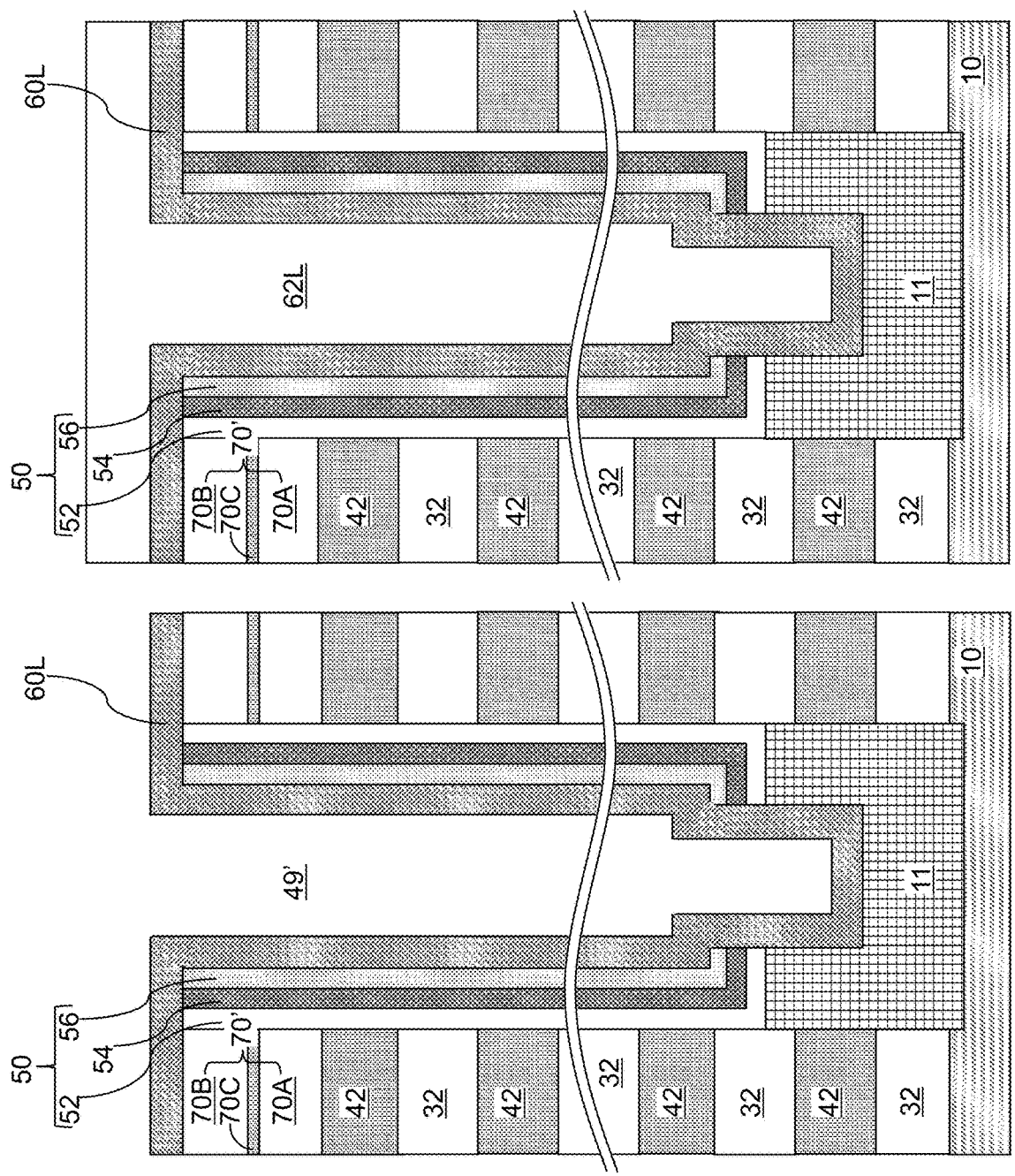

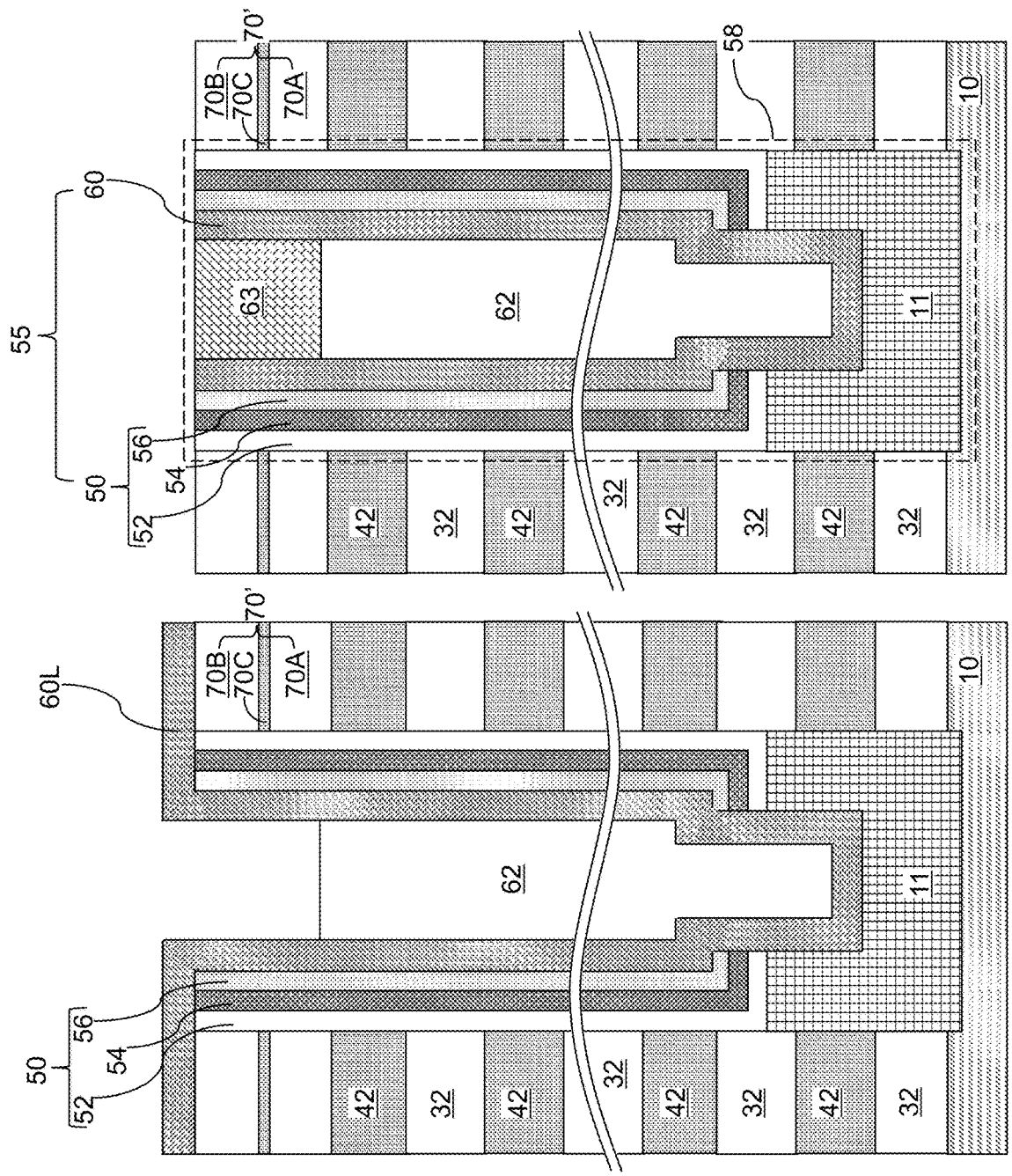

THREE-DIMENSIONAL MEMORY DEVICE INCLUDING A DRAIN CONTACT ETCH-STOP DIELECTRIC LAYER AND METHODS FOR FORMING THE SAME

FIELD

The present disclosure relates generally to the field of semiconductor devices, and particularly to a three-dimensional memory device employing an etch-stop dielectric layer for drain contact via structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers, a composite insulating cap layer located over the alternating stack, memory openings vertically extending through the composite insulating cap layer and the alternating stack, and memory opening fill structures located in the memory openings. Each of the memory opening fill structures includes a vertical semiconductor channel and a vertical stack of memory elements. The composite insulating layer includes a bottom insulating cap layer, a top insulating cap layer, and an etch-stop dielectric layer located between the bottom insulating cap layer and the top insulating cap layer.

According to another aspect of the present disclosure, a method of forming a semiconductor device is provided, which comprises: forming an alternating stack of insulating layers and sacrificial material layers over a substrate; forming an in-process layer stack over the alternating stack, wherein the in-process layer stack comprises a bottom insulating cap layer, a top insulating cap layer, and a sacrificial cap layer located between the bottom insulating cap layer and the top insulating cap layer; a bottom insulating cap layer, a sacrificial cap layer, and a top insulating cap layer; forming a memory opening through the in-process layer stack and the alternating stack; forming a memory opening fill structure within the memory opening; forming a backside trench through the in-process layer stack and the alternating stack; forming backside recesses and a cap-level cavity by removing the sacrificial material layers and the sacrificial cap layer; conformally depositing a dielectric metal oxide material in the backside recesses and the cap-level cavity, wherein a backside blocking dielectric layer is formed at peripheral regions of the backside recesses and an etch-stop dielectric layer completely fills the cap-level cavity; and forming electrically conductive layers in remaining volumes of the backside recesses.

BRIEF DESCRIPTION OF THE DRAWINGS

FIG. 4B is a top-down view of the exemplary structure of FIG. 4A. The vertical plane A-A' is the plane of the cross-section for FIG. 4A.

FIGS. 5A-5H are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
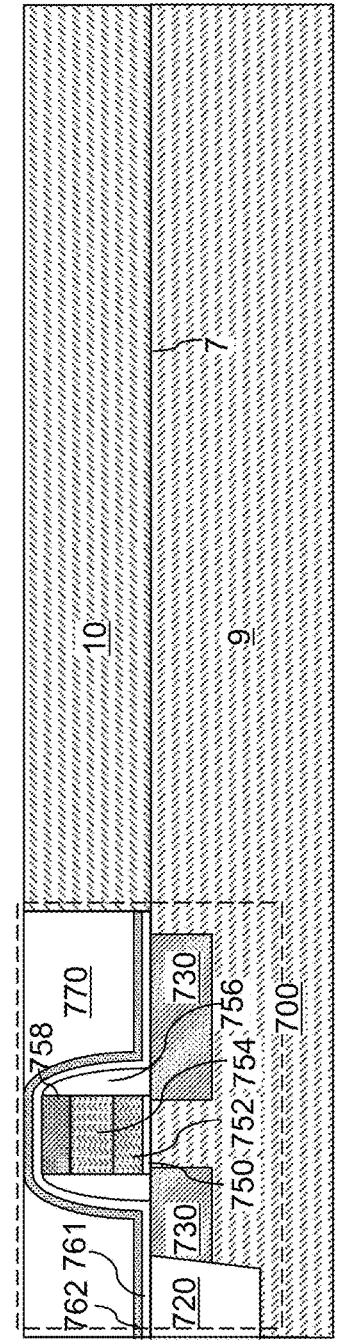
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including an etch-stop dielectric layer for drain contact via structures and methods of making thereof, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{-5}$ S/cm. As used herein, a "semiconductor material" refers to a material having electrical conductivity in the range from $1.0 \times 10^{-6}$ S/cm to $1.0 \times 10^{-5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{-5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
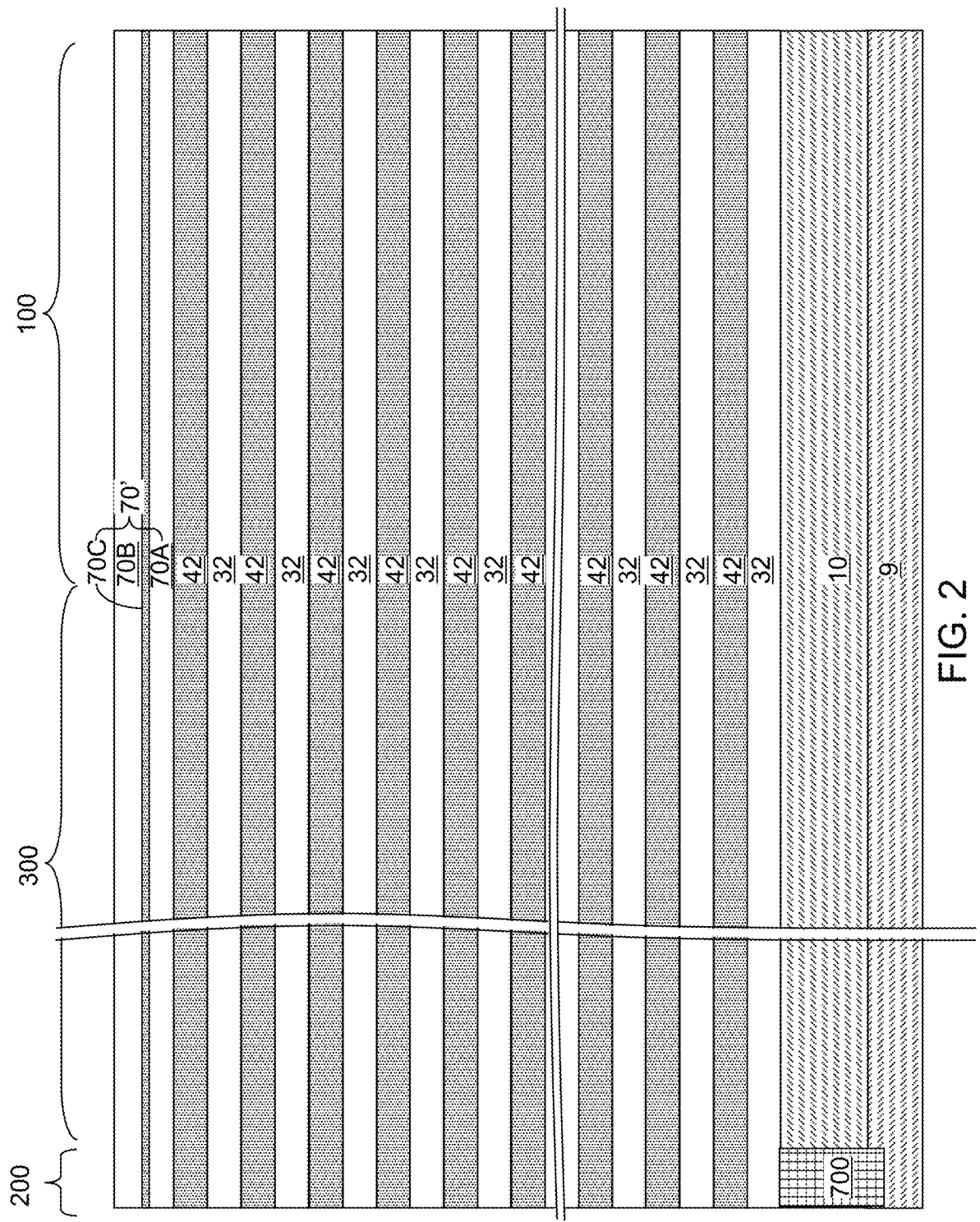
FIG. 2 is a schematic vertical cross-sectional view of the exemplary structure after formation of an alternating stack of insulating layers and sacrificial material layers and an in-process layer stack comprises a bottom insulating cap layer, a sacrificial cap layer, and a top insulating cap layer according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

According to an aspect of the present disclosure, an in-process layer stack 70' can be formed over the topmost layer within the alternating stack (32, 42). The in-process layer stack 70' comprises, from bottom to top, a bottom insulating cap layer 70A, a sacrificial cap layer 70C, and a top insulating cap layer 70B. The bottom insulating cap layer 70A and the top insulating cap layer 70B may comprise a same material as the insulating layers 32. In one embodiment, the bottom insulating cap layer 70A, the top insulating cap layer 70B, and the insulating layers 32 may comprise and/or may consist essentially of silicon oxide. In one embodiment, each of the bottom insulating cap layer 70A and the top insulating cap layer 70B may have a thickness in a range from 20 nm to 100 nm, such as from 30 nm to 60 nm, although lesser and greater thicknesses may also be employed.

According to an aspect of the present disclosure, the sacrificial cap layer 70C may comprise, and/or may consist essentially of, a same material as the sacrificial material layers 42. In one embodiment, the sacrificial material layers 42 and the sacrificial cap layer 70C may comprise and/or may consist essentially of silicon nitride. The thickness of the sacrificial cap layer 70C is less than twice of the thickness of a backside blocking dielectric layer to be subsequently formed. In one embodiment, the thickness of the sacrificial cap layer 70C may be less than one half of the thickness of the sacrificial material layers 42. In one embodiment, the thickness of the sacrificial cap layer 70C may be less than 40%, and/or less than 30%, and/or less than 20%, e.g., 15 to 30% of the thickness of the sacrificial material layers 42. In one embodiment, the thickness of the sacrificial cap layer 70C may be in a range from 2 nm to 20 nm, such as from 4 nm to 16 nm, and/or from 6 nm to 12 nm, although lesser and greater thicknesses may also be employed.

Figure 3:
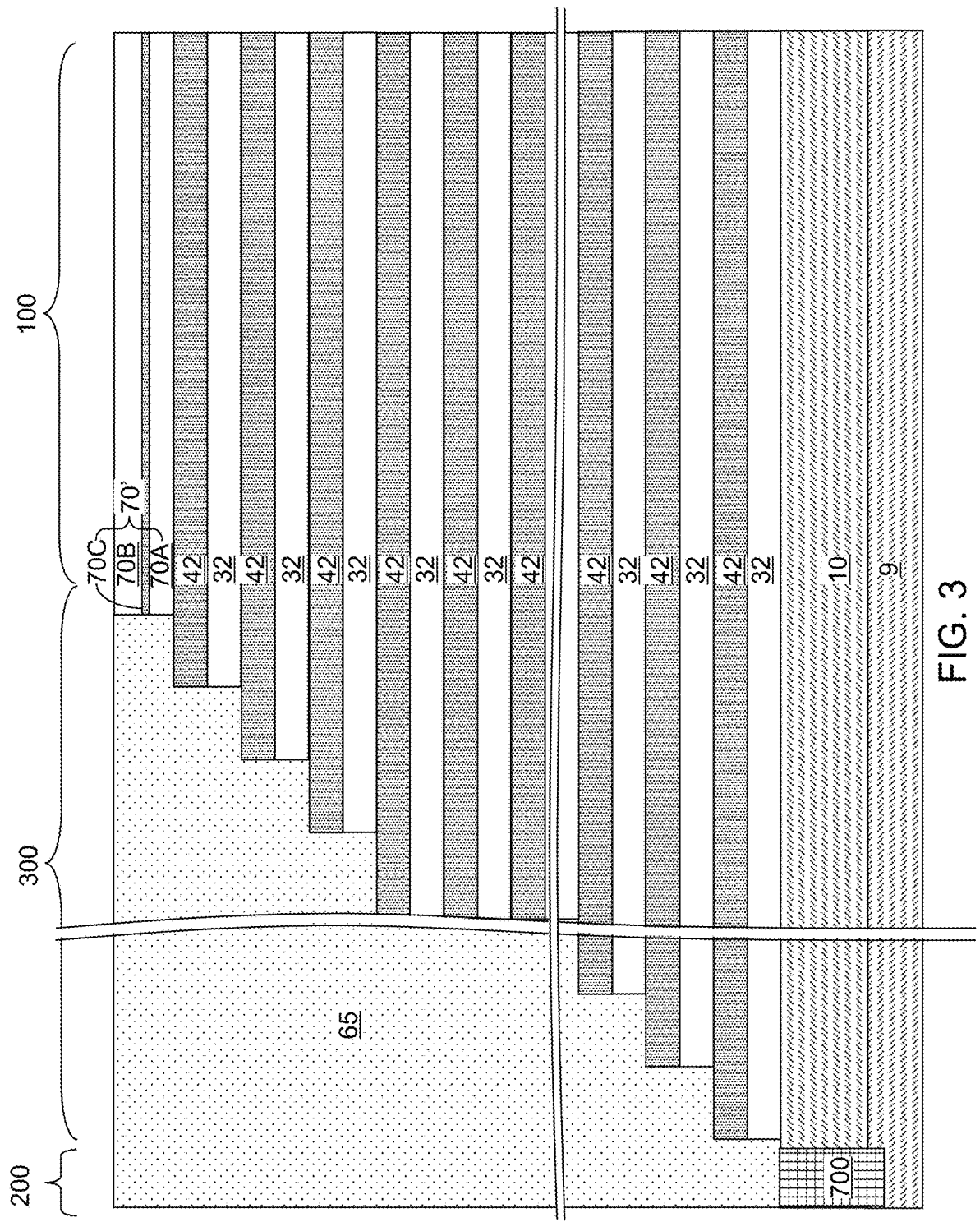
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the in-process layer stack 70', for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the in-process layer stack 70' and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the in-process layer stack 70'.

Figure 4A:
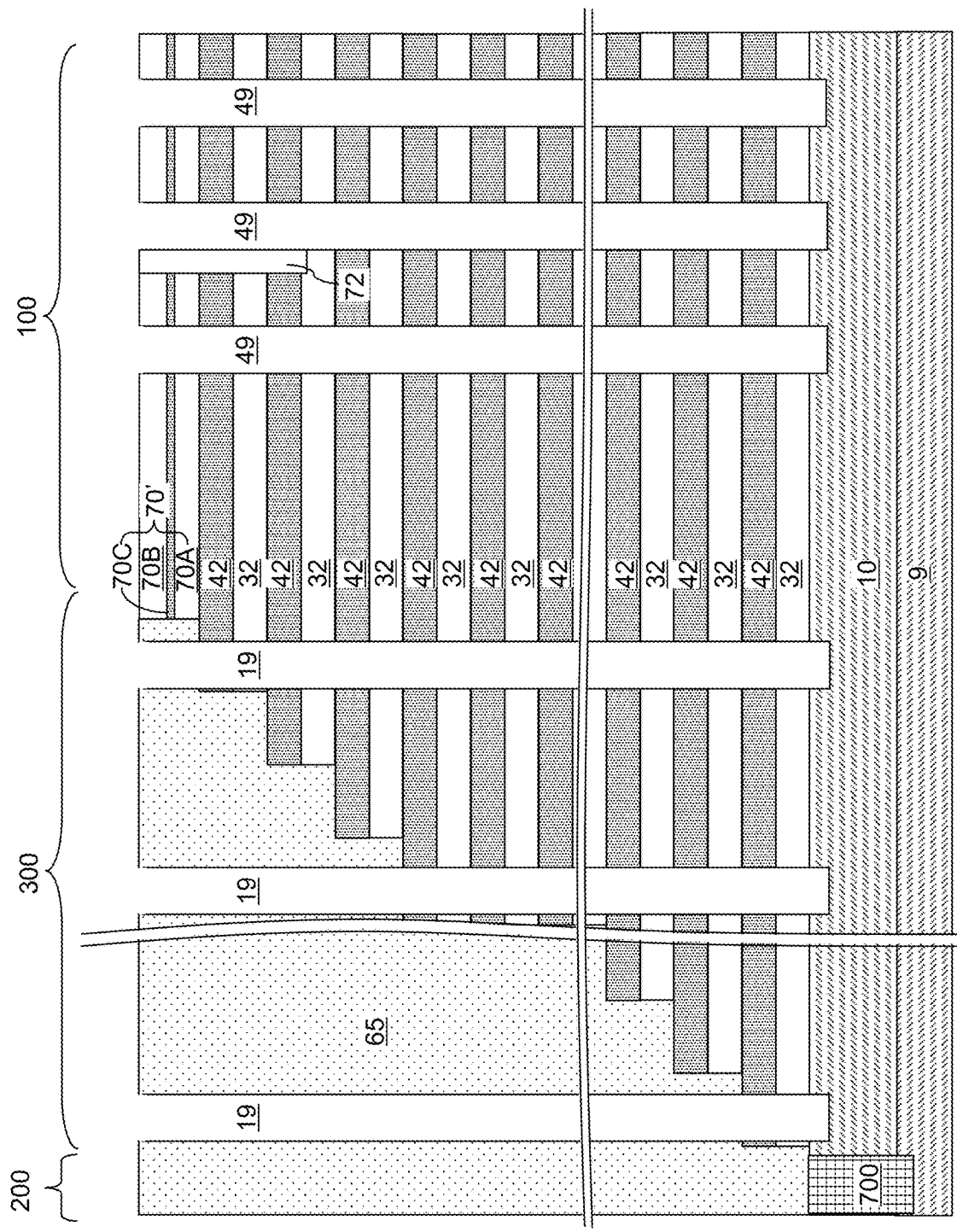
FIG. 4A is a schematic vertical cross-sectional view of the exemplary structure after formation of memory openings and support openings according to an embodiment of the present disclosure.

Referring to FIGS. 4A and 4B, a lithographic material stack (not shown) including at least a photoresist layer can be formed over the in-process layer stack 70' and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the in-process layer stack 70' or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the in-process layer stack 70' and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the in-process layer stack 70', the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. Generally, the memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56, if present, includes at least one dielectric liner material. In one embodiment, the dielectric material liner 56 comprises a tunneling dielectric layer through which charge tunneling can be performed under suitable electrical bias conditions. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the in-process layer stack 70' are sequentially anisotropically etched employing at least one anisotropic etch process. The portions of the sacrificial cover material layer 601, the dielectric material liner 56, the memory material layer 54, and the blocking dielectric layer 52 located above the top surface of the in-process layer stack 70' can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), a or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the in-process layer stack 70'. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the in-process layer stack 70', for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case the blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising the memory material layer 54) located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the memory material layer 54, and the dielectric material liner 56 can be located between the memory material layer 56 and the vertical semiconductor channel 60. A vertical NAND string can be formed through each memory opening upon subsequent replacement of the sacrificial material layers 42 with electrically conductive layers.

Figure 6:
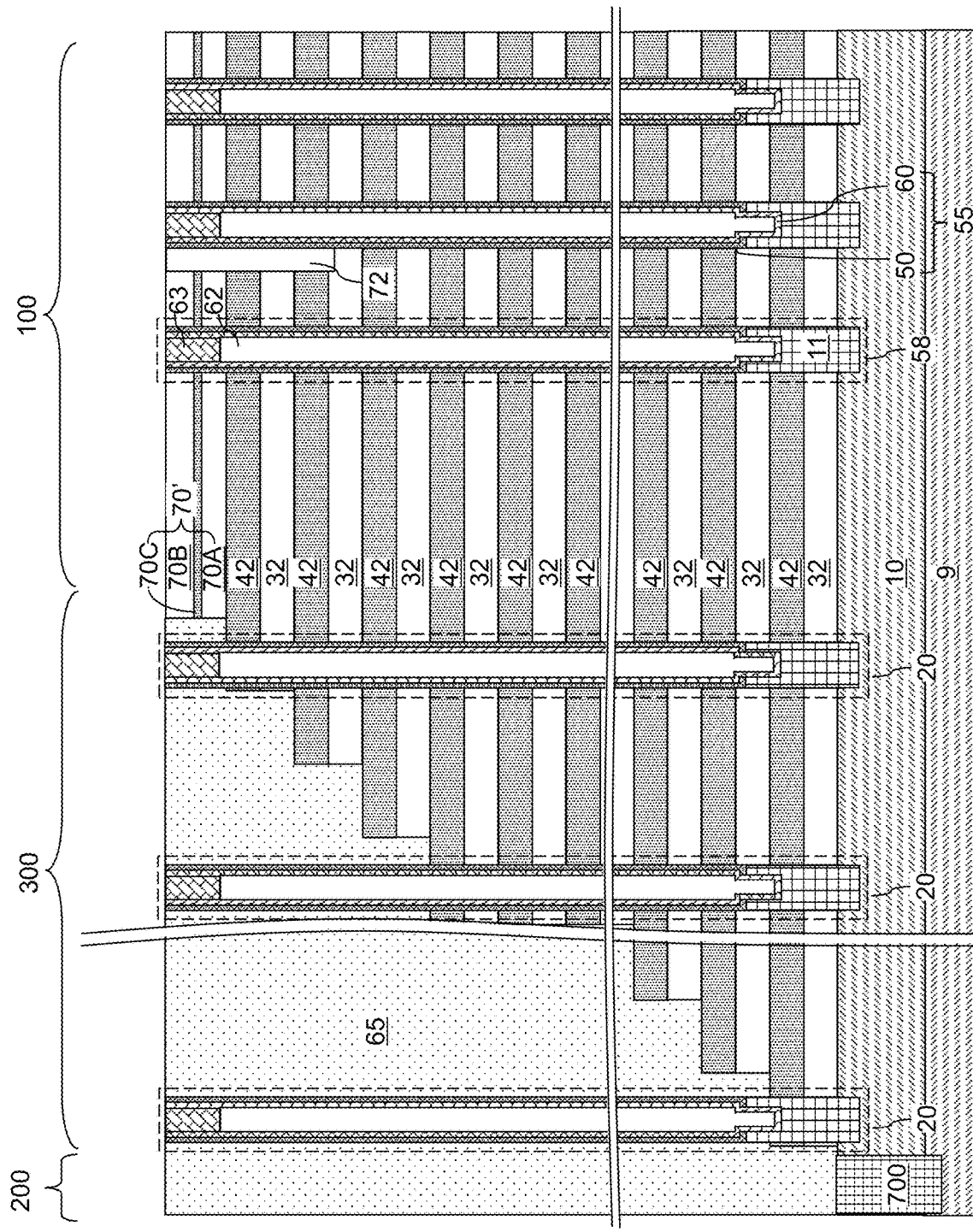
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (comprising portions of the memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
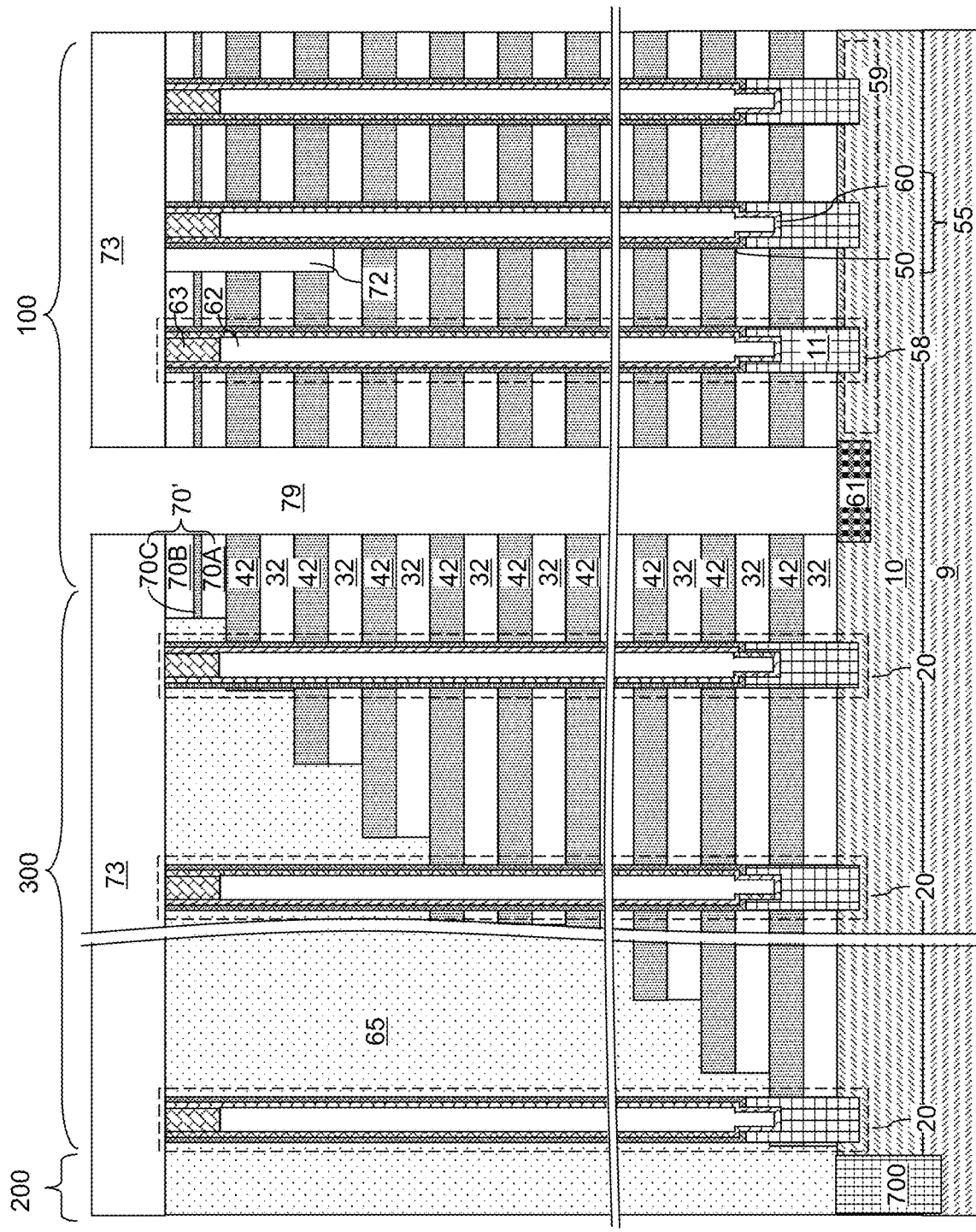
FIG. 7A is a schematic vertical cross-sectional view of the exemplary structure after formation of backside trenches according to an embodiment of the present disclosure.
Figure 7B:
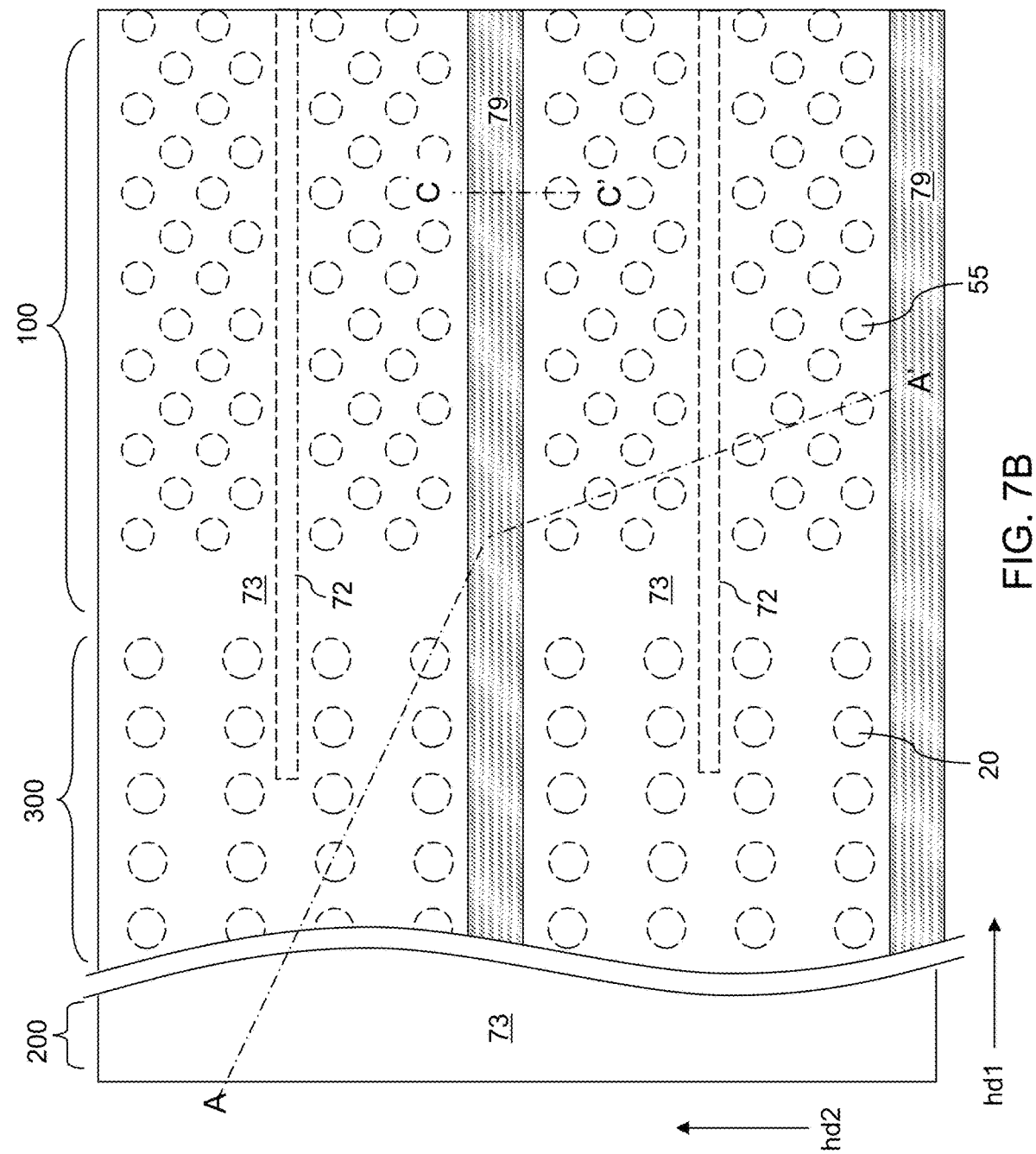
FIG. 7B is a partial see-through top-down view of the exemplary structure of FIG. 7A. The vertical plane A-A' is the plane of the schematic vertical cross-sectional view of FIG. 7A.
Figure 7C:
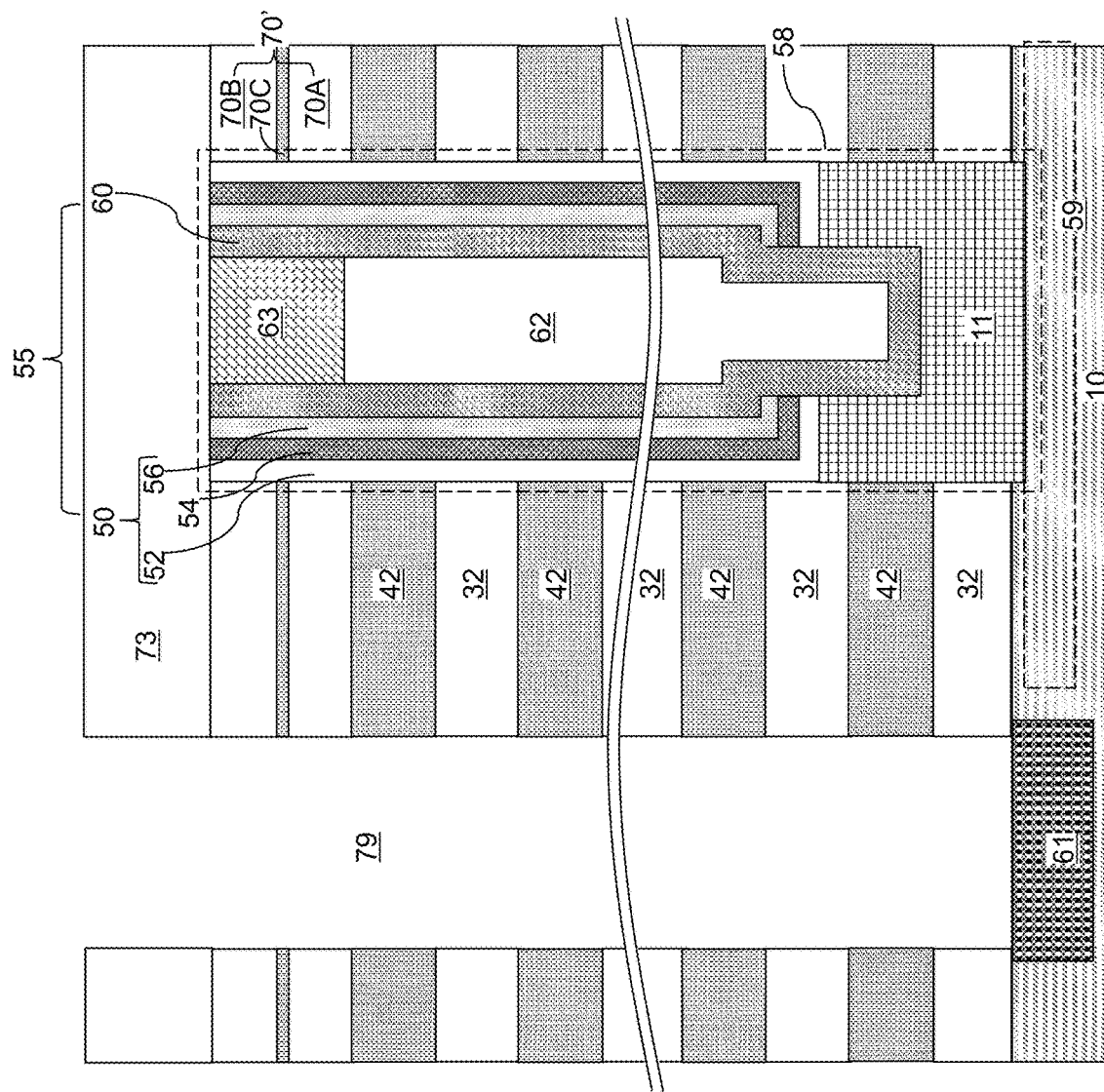
FIG. 7C is a vertical cross-sectional view of the exemplary structure along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 8:
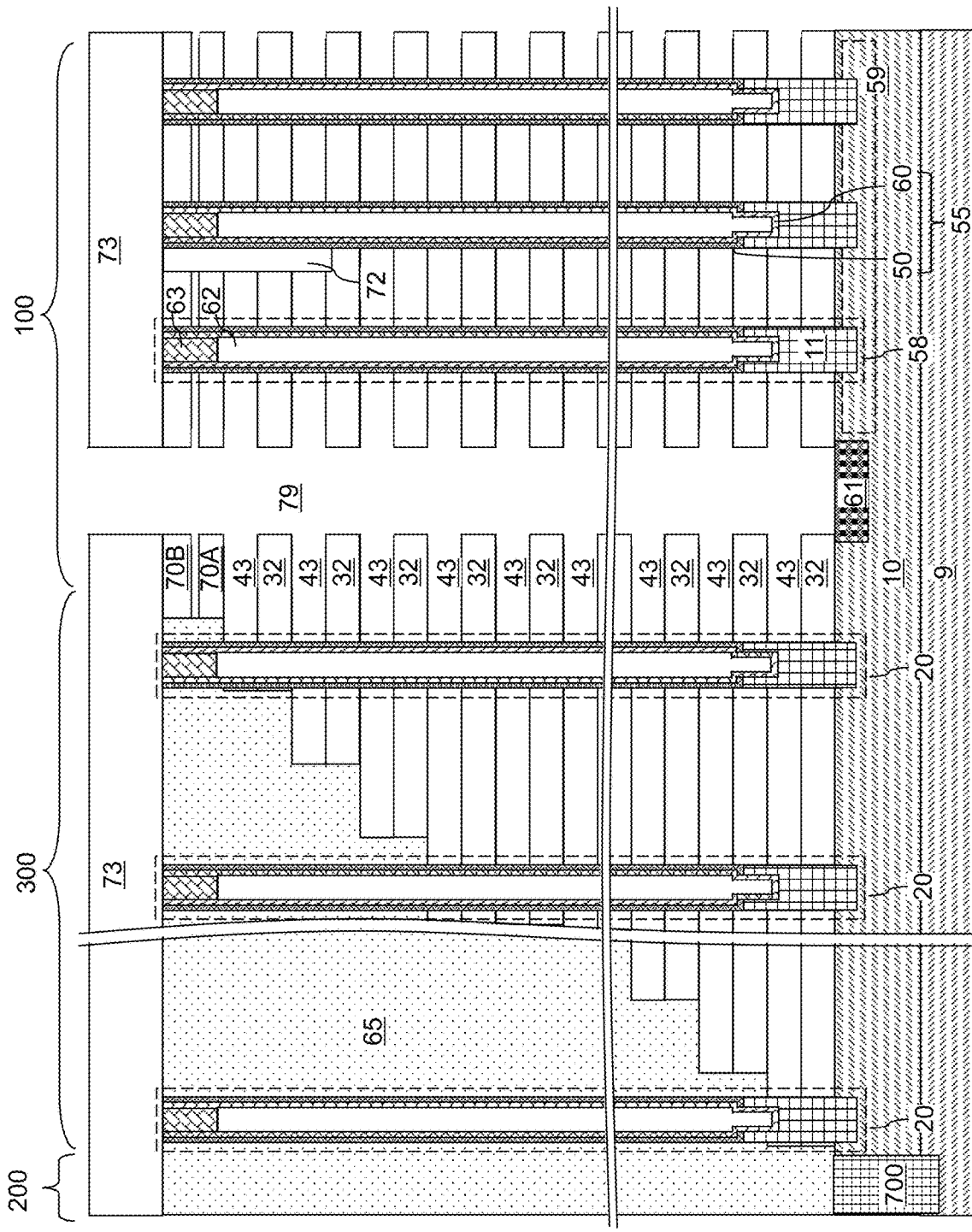
FIG. 8 is a schematic vertical cross-sectional view of the exemplary structure after formation of backside recesses according to an embodiment of the present disclosure.
Figure 9A:
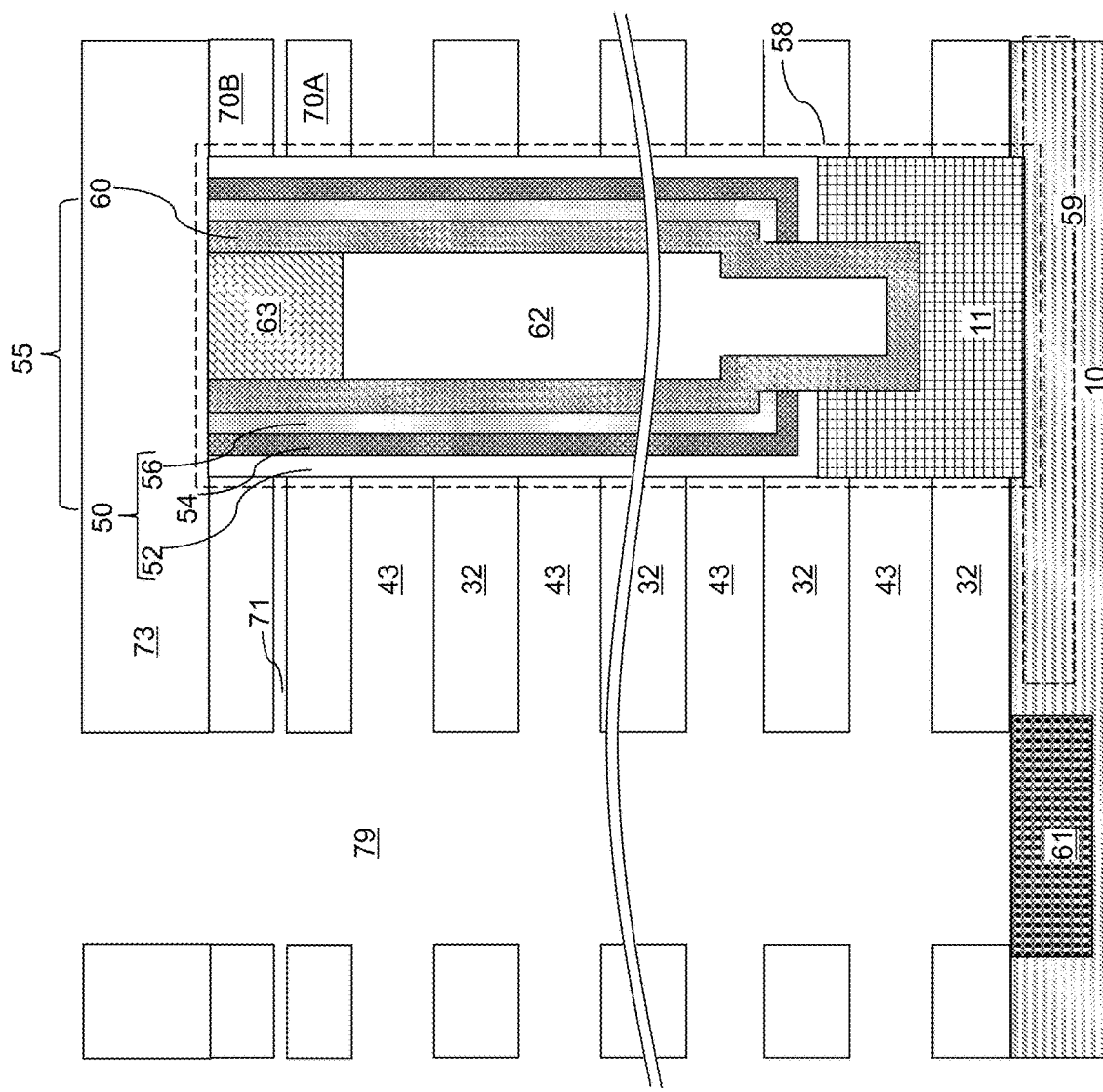
FIGS. 9A-9D are sequential vertical cross-sectional views of a region of the exemplary structure during formation of a backside blocking dielectric layer, an etch-stop dielectric layer, and electrically conductive layers according to an embodiment of the present disclosure.

Referring to FIGS. 8 and 9A, an etchant that selectively etches the second material of the sacrificial material layers 42 and the sacrificial cap layer 70C with respect to the first material of the insulating layers 32 can be introduced into the backside trenches 79, for example, employing an etch process. The etch process can be an isotropic etch process. FIG. 9A illustrates a region of the exemplary structure of FIG. 8. The duration of the isotropic etch process can be selected such that the entirety of the sacrificial material layers 42 and the entirety of the sacrificial cap layer 70C are removed by the isotropic etch process.

Backside recesses 43 are formed in volumes from which the sacrificial material layers 42 are removed. A cap-level cavity 71 is formed in each volume from which the sacrificial cap layer 70C is removed. The cap-level cavity 71 has a smaller height than the height of the backside recesses 43. The cap-level cavities 71 may be laterally spaced from each other by the backside trenches 79. A cylindrical surface segment of each memory opening fill structure 58 is physically exposed to a respective cap-level cavity 71 upon formation of the cap-level cavities 71. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50 (such as the material of the blocking dielectric layers 52). In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 and the sacrificial cap layer 70C include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The cap-level cavity 71 is formed in the volume from which the material of the sacrificial cap layer 70C is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. The cap-level cavity 71 can be vertically bounded by the bottom insulating cap layer 70A and the top insulating cap layer 70B. In one embodiment, the cap-level cavity 71 can have a uniform height throughout, which is less than 50%, and/or less than 40%, and/or less than 30%, and/or less than 20%, such as 15 to 30% of the height of each backside recess 43.

Figure 9B:
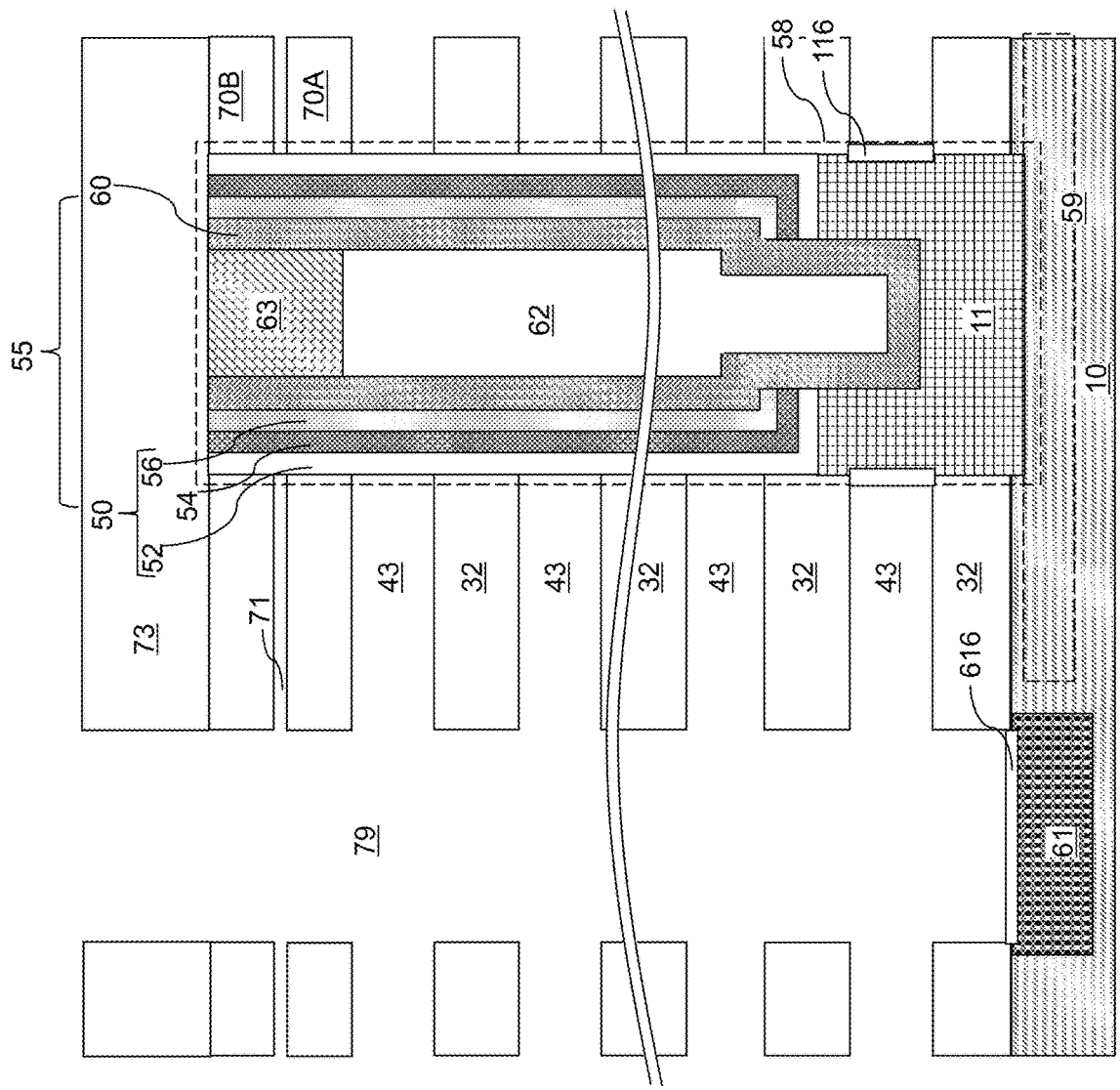

Referring to FIG. 9B, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9C:
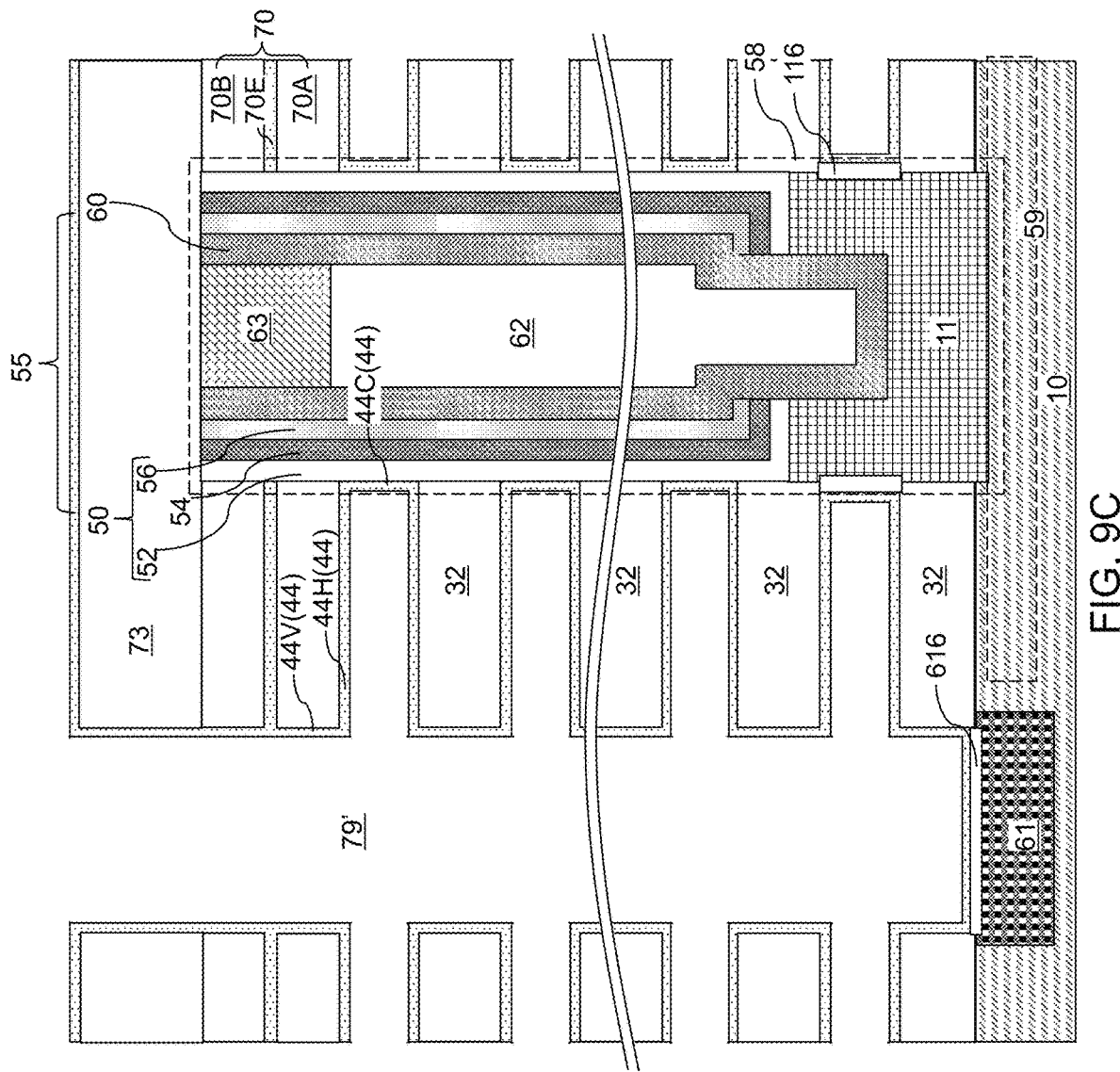

Referring to FIG. 9C, a dielectric metal oxide material can be conformally deposited in the backside recesses 43 and in the cap-level cavities 71. According to an aspect of the present disclosure, the dielectric metal oxide material may be conformally deposited with a uniform thickness that is greater than one half of the height of each cap-level cavity 71. Thus, the dielectric metal oxide material completely fills the volumes of the cap-level cavities 71. Further, the dielectric metal oxide material can be conformally deposited on physically exposed surfaces around each of the backside recesses 43. The dielectric metal oxide material may be conformally deposited by a chemical vapor deposition process or by an atomic layer deposition process.

Each portion of the deposited dielectric metal oxide material that is formed in a respective cap-level cavity 71 constitutes an etch-stop dielectric layer 70E. The portions of the deposited dielectric metal oxide material located outside the cap-level cavities 71 constitute a backside blocking dielectric layer 44. Thus, the deposited dielectric metal oxide material forms a backside blocking dielectric layer 44 at peripheral regions of the backside recesses 43, and an etch-stop dielectric layer 70E that completely fills each cap-level cavity 71. Each contiguous combination of the bottom insulating cap layer 70A, the etch-stop dielectric layer 70E, and the top insulating cap layer 70B constitutes a composite insulating cap layer 70.

The backside blocking dielectric layer 44 comprises vertically-extending portions 44V that are formed on sidewalls of the insulating layers 32, the bottom insulating cap layer the top insulating cap layer 70B, and the contact-level dielectric layer 73. The vertically-extending portion 44V of the backside blocking dielectric layer 44 may contact a sidewall of the contact-level dielectric layer 73, a sidewall of the top insulating cap layer and a sidewall of the bottom insulating cap layer 70A, and may be adjoined to an etch-stop dielectric layer 70E. The backside blocking dielectric layer 44 further comprises horizontally-extending portions 44H that are formed on horizontal surfaces of the insulating layers 32, on the top surface of the contact-level dielectric layer 73, and on the planar dielectric portions 616. The backside blocking dielectric layer 44 further comprises cylindrical portions 44C that laterally surround and contact a respective cylindrical surface segment of a respective memory opening fill structure 58 or a respective support pillar structure 20.

In one embodiment, the etch-stop dielectric layer 70E has a different thickness than the backside blocking dielectric layer 44. In one embodiment, the backside blocking dielectric layer 44 has a first uniform thickness throughout, and the etch-stop dielectric layer 70E has a second thickness that is greater than 50% of the first uniform thickness and is less than twice the second uniform thickness. In one embodiment, the backside blocking dielectric layer 44 may continuously extend from above the top surface of substrate (9, 10) (e.g., from the planar dielectric portions 616) to the contact-level dielectric layer 73. In one embodiment, sidewall segments of each memory opening fill structures 58 located at levels of the backside recesses 43 may be laterally surrounded by and may be laterally contacted by the backside blocking dielectric layer 44.

The thickness of the backside blocking dielectric layer 44 can be in a range from 1.2 nm to 15 nm, such as 2 to 8 nm, although lesser and greater thicknesses can also be employed. The thickness of each etch-stop dielectric layer 70E may be in a range from 2 nm to 20 nm, such as from 4 nm to 16 nm, and/or from 6 nm to 12 nm, although lesser and greater thicknesses may also be employed. The dielectric material of the backside blocking dielectric layer 44 and the etch-stop dielectric layer 70E can be a dielectric metal oxide, such as aluminum oxide, a dielectric oxide of at least one transition metal element, a dielectric oxide of at least one Lanthanide element, a dielectric oxide of a combination of aluminum, at least one transition metal element, and/or at least one Lanthanide element. In one embodiment, the backside blocking dielectric layer 44 and the etch-stop dielectric layer 70E may consist essentially of aluminum oxide. A backside cavity 79' is present within the portion of each backside trench 79 that is not filled with the backside blocking dielectric layer 44.

Figure 9D:
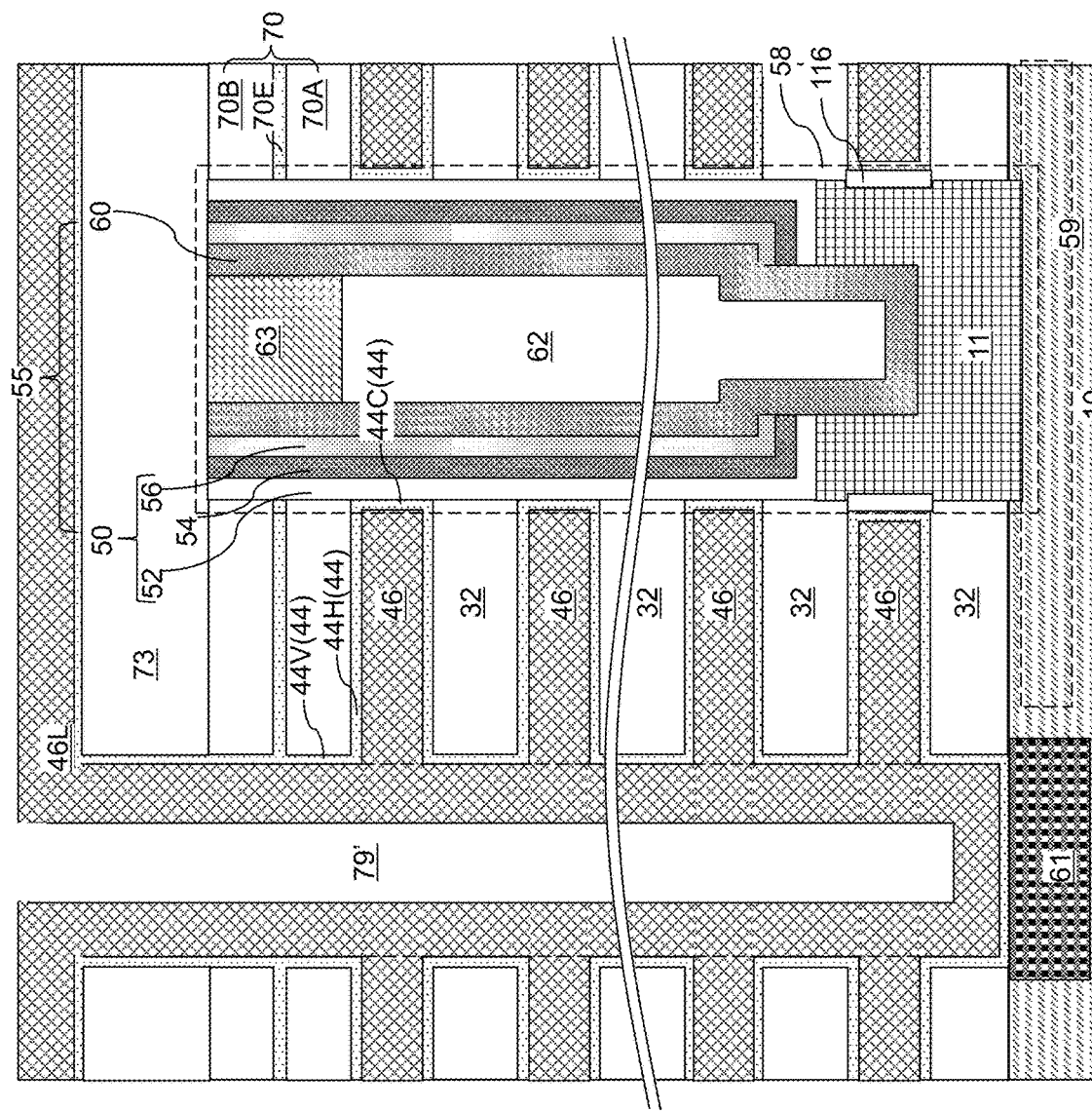

Referring to FIG. 9D, at least one metallic material can be conformally deposited in remaining volumes of the backside recesses 43, in peripheral regions of the backside trenches 79, and above the contact-level dielectric layer 73. For example, the at least one metallic material may comprise a metallic barrier layer and a metallic fill material. For example, a metallic barrier layer (not expressly shown) can be conformally deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

Subsequently, a metal fill material is deposited in the plurality of backside recesses 43, on the sidewalls of the at least one the backside trench 79, and over the top surface of the contact-level dielectric layer 73 to form a metallic fill material layer (not expressly shown). The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer 46L includes a continuous portion of the metallic barrier layer and a continuous portion of the metallic fill material layer that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46. The electrically conductive layers 46 are formed in remaining unfilled volumes of the backside recesses 43 after formation of the backside blocking dielectric layer 44 and the etch-stop dielectric layers 70E. The backside blocking dielectric layer 44 comprising a first portion of a dielectric metal oxide material which is located between each vertically neighboring pair of an insulating layer 32 and an electrically conductive layer 46 within the alternating stack (32, 46). Each etch-stop dielectric layer 70E comprises a second portion of the dielectric metal oxide material that completely fills a respective one of the cap-level cavities 71 and thus prevents formation of the electrically conductive layer 46 in the cap-level cavities 71.

Figure 10A:
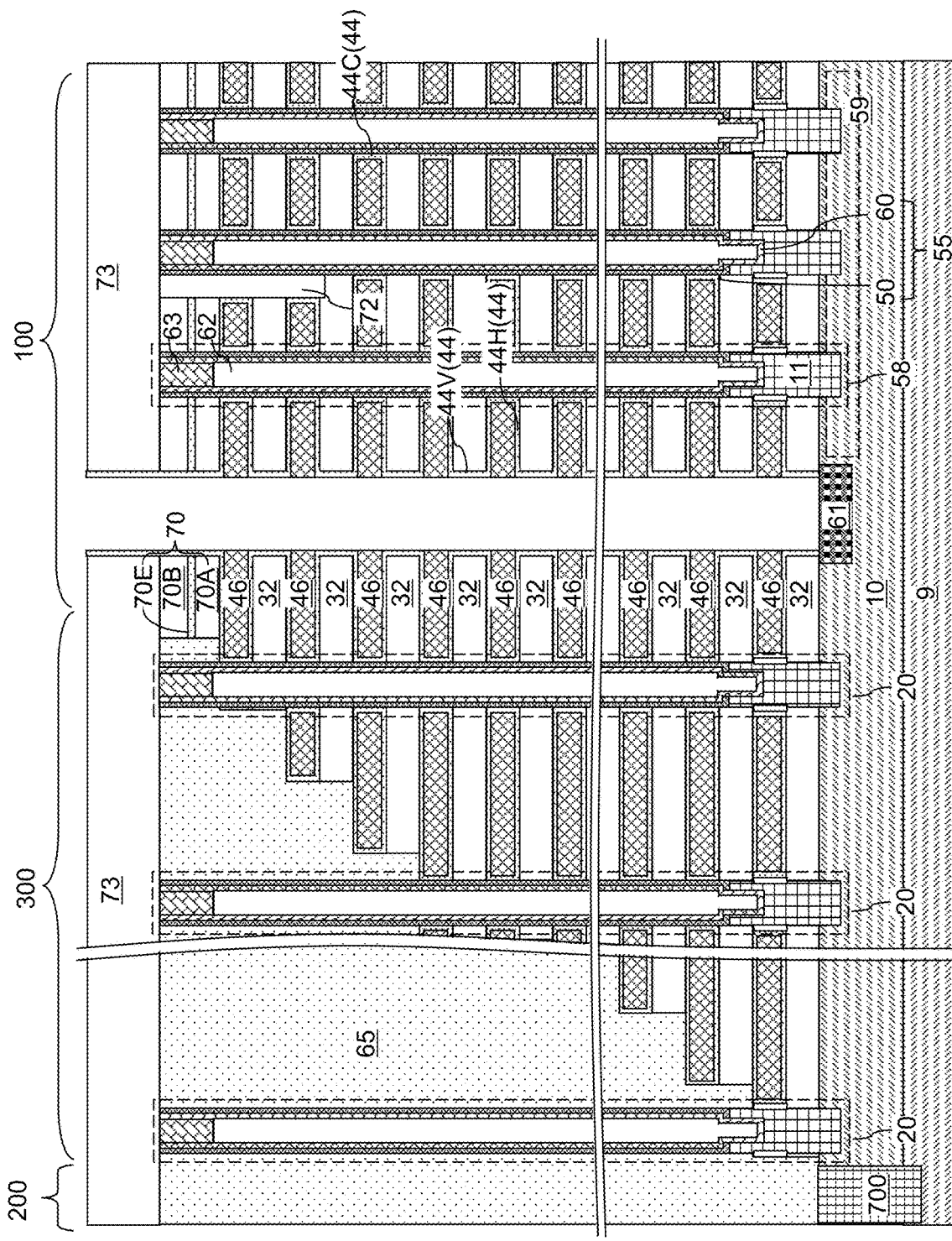
FIG. 10A is a schematic vertical cross-sectional view of the exemplary structure after removal of a continuous metallic material layer from inside the backside trenches and from above the contact-level dielectric layer according to an embodiment of the present disclosure.
Figure 10B:
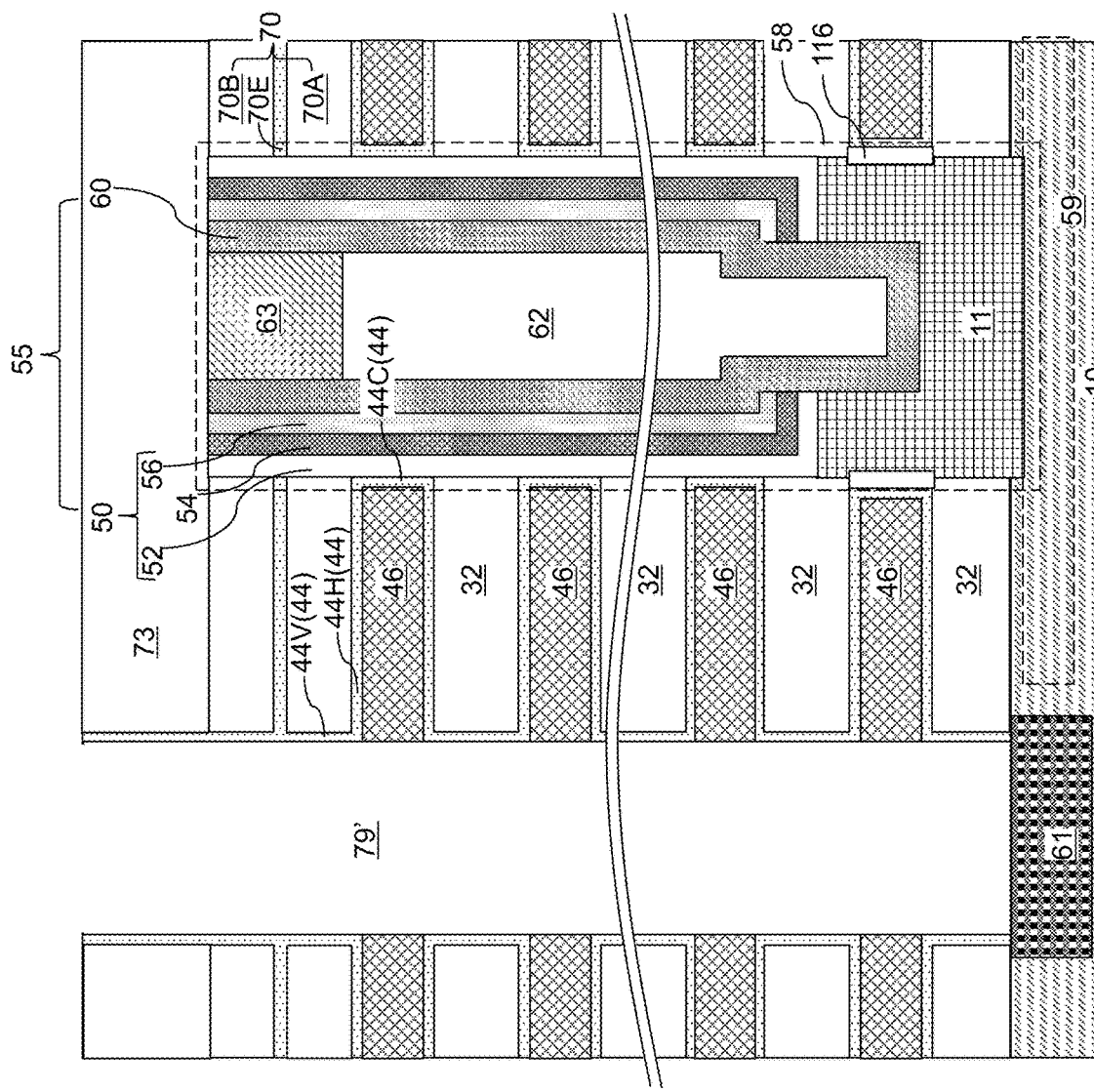
FIG. 10B is magnified view of a region of the exemplary structure of FIG. 10A.

Referring to FIGS. 10A and 10B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. In one embodiment, the removal of the continuous electrically conductive material layer 46L can be selective to the material of the backside blocking dielectric layer 44.

An anisotropic etch process can be subsequently performed to remove unmasked horizontally-extending portions of the backside blocking dielectric layer 44. Horizontally-extending portions of the backside blocking dielectric layer 44 located above the top surface of the contact-level dielectric layer 73 or on a top surface of any of the planar dielectric portions 616 can be removed during the anisotropic etch process. Vertically-extending potions 44V of the backside blocking dielectric layer 44 may remain on the sidewalls of the insulating layers 32, the composite insulating cap layer 70, and the contact-level dielectric layer 73. Upon removal of the horizontally-extending portions 44H of the backside blocking dielectric layer 44 from outside the volumes of the backside recesses 43, the backside blocking dielectric layer 44 may be divided into a plurality of backside blocking dielectric layers 44 that are not adjoined to each other (i.e., that do not directly contact one another), and contact a respective alternating stack (32, 46) of insulating layers 32 and electrically conductive layers 46.

The anisotropic etch process may be continued with a change in the etch chemistry to etch the material of the planar dielectric portions 616. The planar dielectric portions 616 can be removed by the anisotropic etch process, and a top surface of each source region 61 can be physically exposed. A backside cavity 79' is present within each backside trench 79.

At least one bottommost electrically conductive layer 46 provided upon formation of the electrically conductive layers 46 within the alternating stack (32, 46) can comprise a source side select gate electrode for the vertical NAND strings. At least one topmost electrically conductive layer 46 provided upon formation of the electrically conductive layers 46 within the alternating stack (32, 46) can comprise a drain side select gate electrode for the vertical NAND strings. The remaining electrically conductive layers 46 can comprise word lines. The source region 61 is optionally formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Figure 11A:
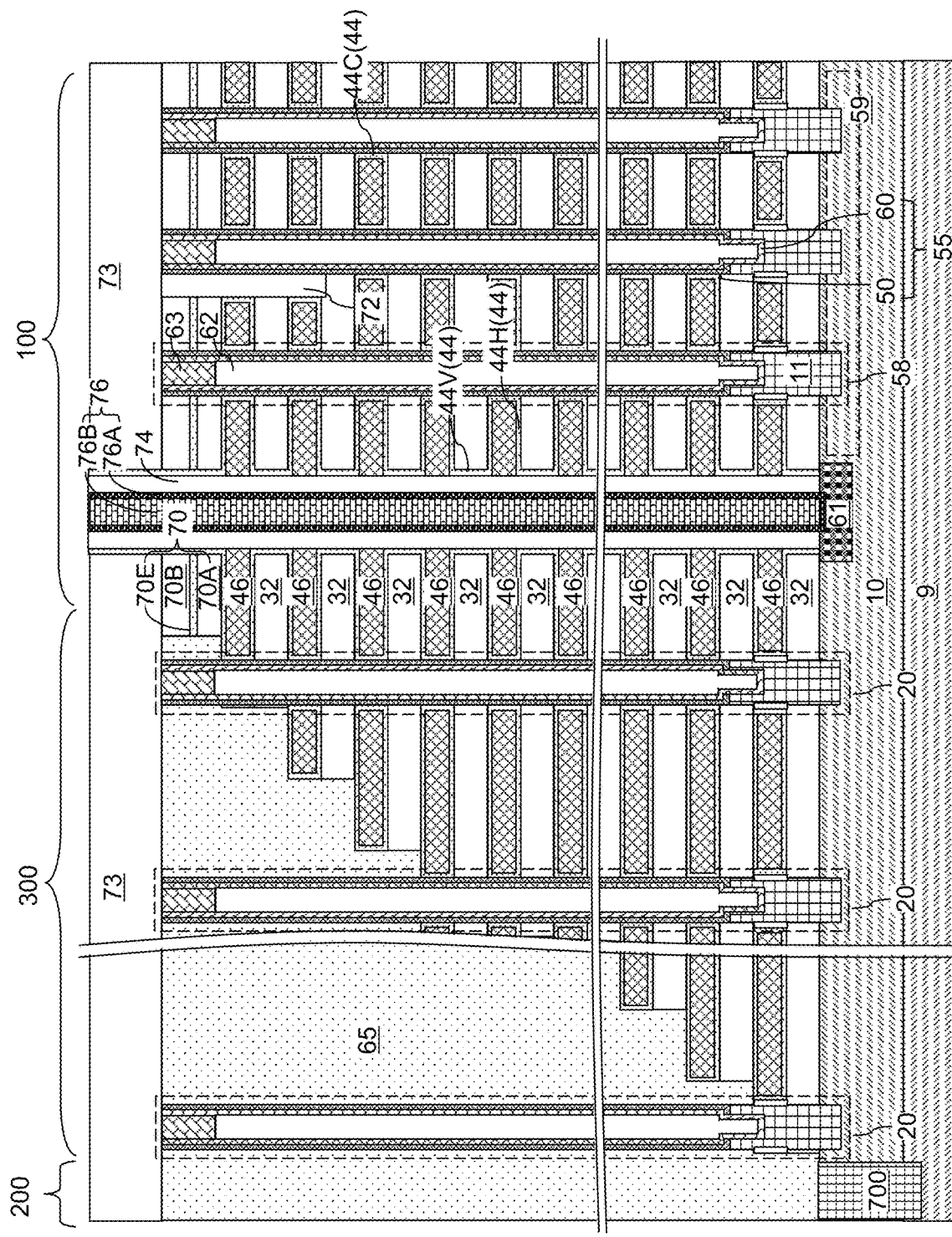
FIG. 11A is a schematic vertical cross-sectional view of the exemplary structure after formation of an insulating spacer and a backside contact structure according to an embodiment of the present disclosure.
Figure 11B:
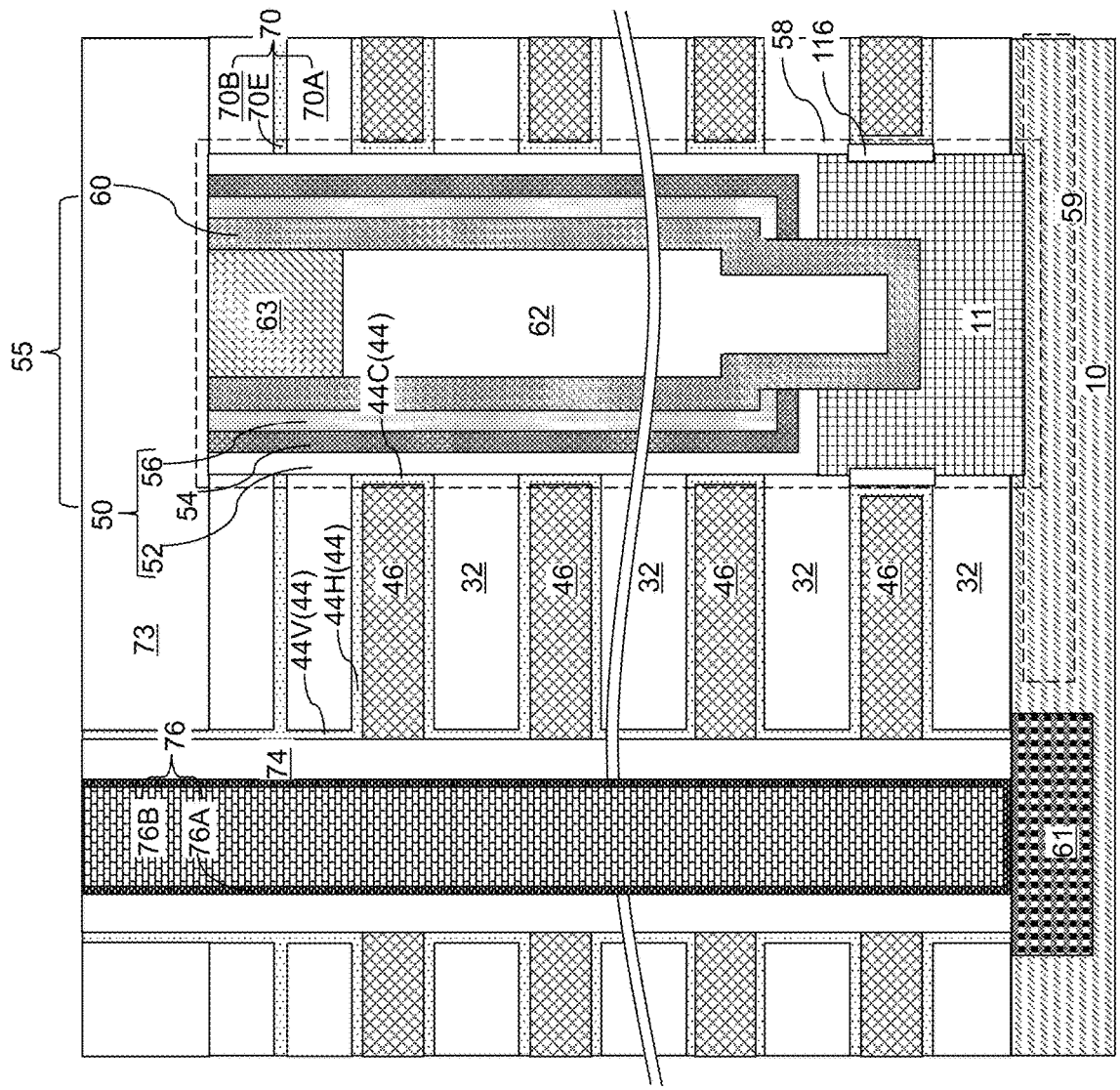
FIG. 11B is a magnified view of a region of the exemplary structure of FIG. 11A.

Referring to FIGS. 11A and 11B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. The insulating material layer can be formed directly on surfaces of vertically-extending portions 44V of the backside blocking dielectric layer 44 and directly on the sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44. Each backside contact via structure 76 contacts a respective source region 63, and contacts vertically-extending portions of a pair of backside blocking dielectric layers 44.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact a side of the lower portion of the semiconductor channel 60.

Figure 12A:
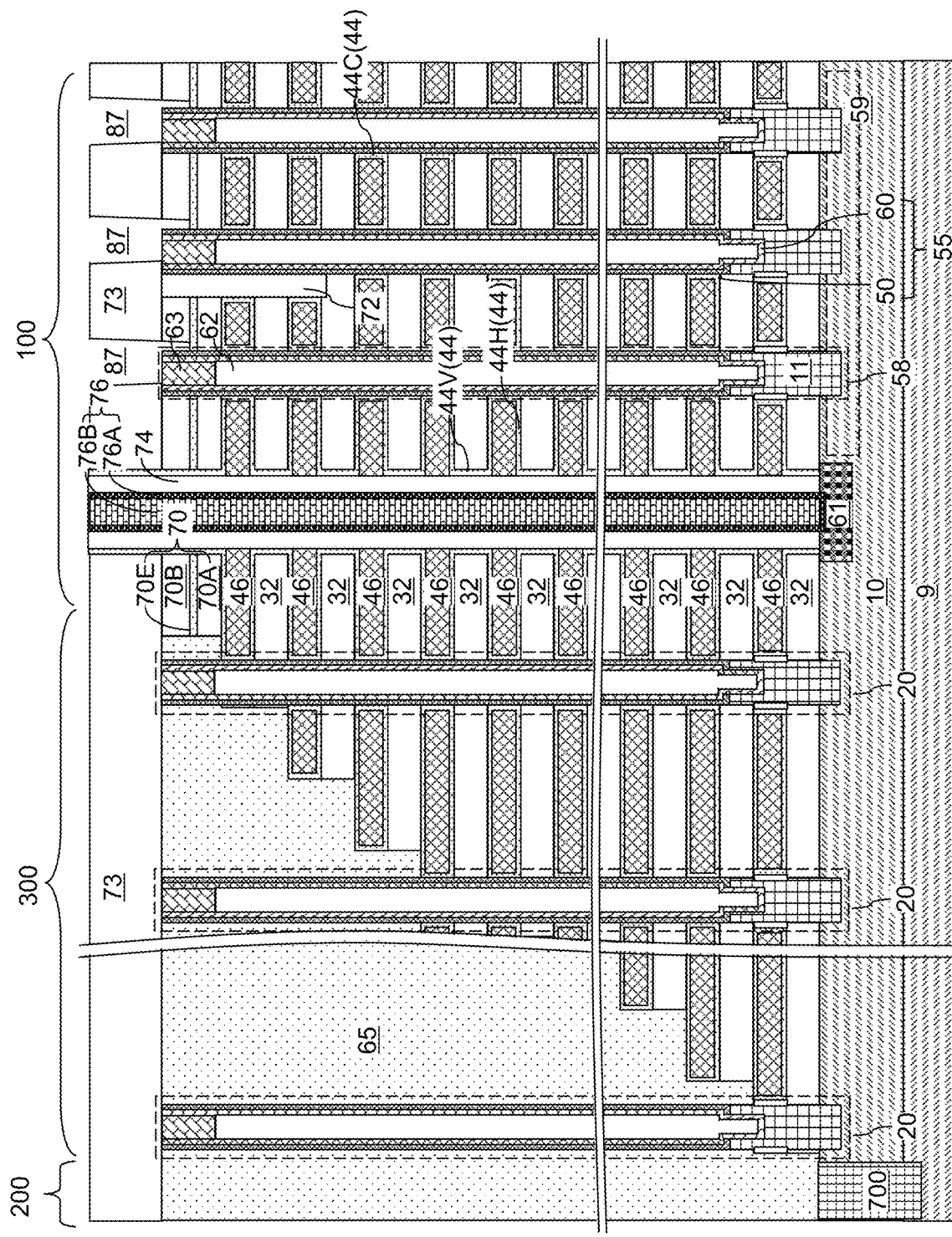
FIG. 12A is a schematic vertical cross-sectional view of the exemplary structure after formation of drain contact via cavities according to an embodiment of the present disclosure.
Figure 12B:
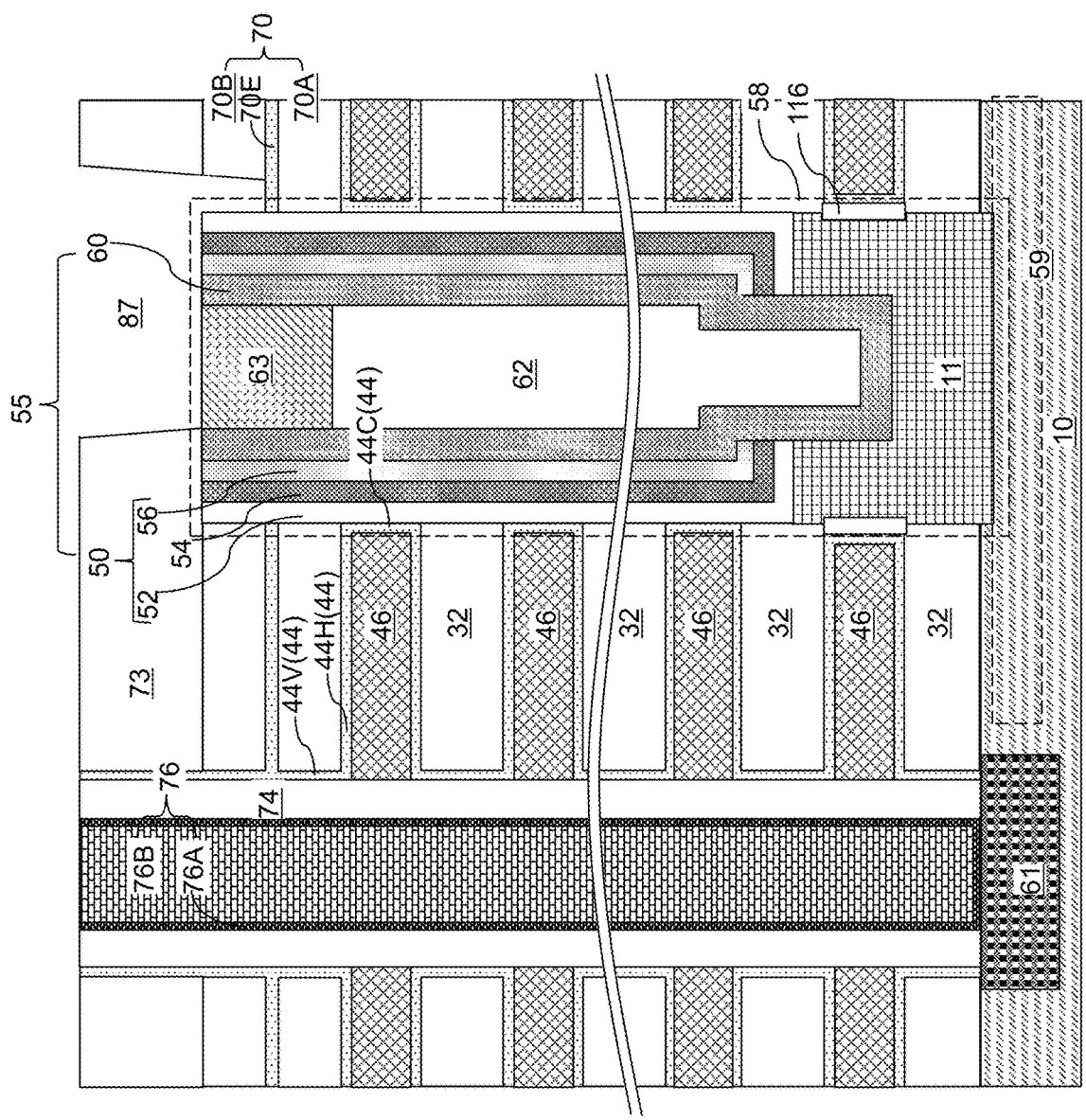
FIG. 12B is a magnified view of a region of the exemplary structure of FIG. 12A.

Referring to FIGS. 12A and 12B, an etch mask layer (not shown), such as a photoresist layer, may be applied over the top surface of the contact-level dielectric layer 73, and can be lithographically patterned to form an array of openings having a same pattern as the pattern of the memory openings 49 (which is the same as the pattern of the memory opening fill structures 58). Generally, each opening within the patterned etch mask layer (such as a patterned photoresist layer) has an areal overlap with the area of a drain region 63 within a respective one of the memory opening fill structures. The lateral overlay error between the geometrical center of each opening in the photoresist layer and the geometrical center of a respective underlying drain region 63 is generally non-zero, and may be in a range from 0% to 50%, and or from 1% to 30%, of the lateral dimension of a memory opening fill structure 58.

An anisotropic etch process can be performed to transfer the pattern of the openings in the patterned etch mask layer through the contact-level dielectric layer 73 and to physically expose a predominant fraction (i.e., 50% or more) of the area of the top surface of each of the underlying drain regions 63. The anisotropic etch process may have an etch chemistry that etches the material of the contact-level dielectric layer 73 selective to the material of the drain regions 63. Generally, the top insulating cap layer 70B may comprise a same material or a similar material as the contact-level dielectric layer 73. For example, the contact-level dielectric layer 73 and the top insulating cap layer 70B may comprise a respective silicon-oxide based dielectric material such as undoped silicate glass (e.g., silicon dioxide) or a doped silicate glass. Thus, collateral etching of the material of the top insulating cap layer 70B may occur during the anisotropic etch process that etches the material of the contact-level dielectric layer 73.

Drain contact via cavities 87 are formed in volumes from which materials of the contact-level dielectric layer 73 and the top insulating cap layer 70B are removed underneath a respective opening in the patterned etch mask layer. Generally, the drain contact via cavities 87 can be formed through the contact-level dielectric layer 73 by forming a patterned etch mask layer over the contact-level dielectric layer 73, and by anisotropically etching portions of the contact-level dielectric layer 73 that are not masked by the patterned etch mask layer. According to an embodiment of the present disclosure, the anisotropic etch process has an etch chemistry that etches materials of the contact-level dielectric layer 73 and the top insulating cap layer 70B selective to the dielectric metal oxide material of the etch-stop dielectric layer 70E and the semiconductor material (e.g., doped silicon) of the drain regions 63.

In one embodiment, the lateral overlay error during patterning of the openings in the patterned etch mask layer may be large enough for one, a plurality or each of the drain contact via cavities 87 to over etch the insulating cap layer 70B such that a sidewall of the memory film 50 is physically exposed in one, plurality, or each of the drain contact via cavities 87. In one embodiment, the lateral overlay error during patterning of the openings in the patterned etch mask layer may be large enough for one, a plurality, or each, of the drain contact via cavities 87 and the collateral etching of the top insulating cap layer 70B may proceed throughout the entire thickness of the top insulating cap layer 70B such that a top surface segment of the etch-stop dielectric layer 70E is physically exposed to the one, the plurality or each of the drain contact via cavities 87. According to an aspect of the present disclosure, the etch-stop dielectric layer 70E acts as an etch stop during etching of the drain contact via cavities and provides sufficient etch resistance in case any portion of the top insulating cap layer 70B is etched through, and a top surface segment of the etch-stop dielectric layer 70E is physically exposed at the bottom of one, a plurality or each of the drain contact via cavities 87. Thus, the drain contact via cavities 87 do not vertically extend into the bottom insulating cap layer 70A due to the presence of the etch-stop dielectric layer 70E, and therefore, do not extend to a topmost electrically conductive layer 46 (e.g., top drain side select gate electrode). Electrical short between the topmost electrically conductive layer 46 and drain contact via structures to be subsequently formed in the cavity 87 can be avoided because the etch-stop dielectric layer 70E prevents vertical extension of the drain contact via cavities 87 through the bottom insulating cap layer 70A. The patterned etch mask layer (such as a photoresist layer) can be subsequently removed, for example, by ashing.

Figure 13:
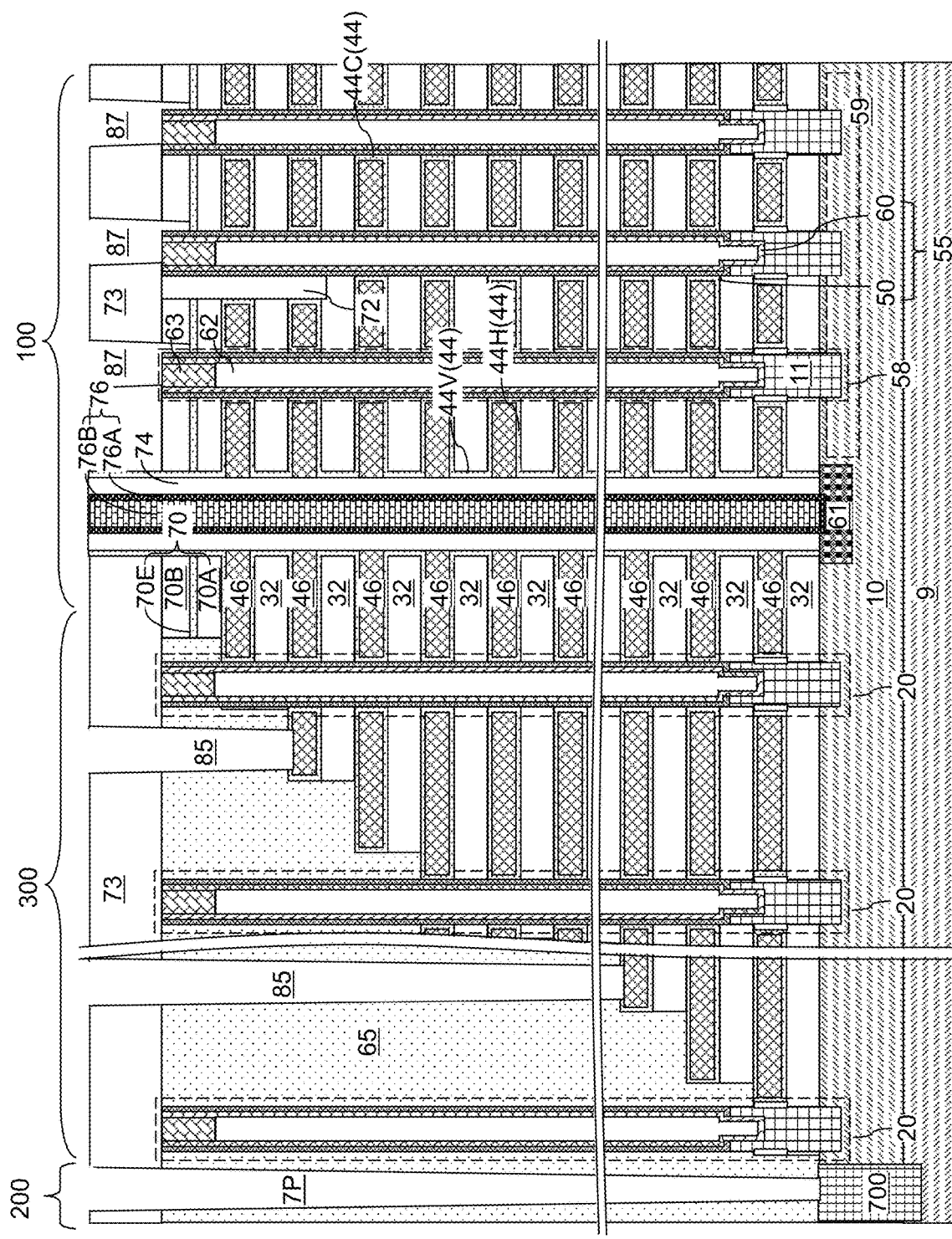
FIG. 13 is a schematic vertical cross-sectional view of the exemplary structure after formation of layer-contact via cavities according to an embodiment of the present disclosure.

Referring to FIG. 13, another patterned etch mask layer (such as an additional photoresist layer) can be applied over the contact-level dielectric layer 73, and can be lithographically patterned to form opening in areas of the horizontal steps of the stepped surfaces on the alternating stacks (32, 46) of the insulating layers 32 and the electrically conductive layers 46. The stepped surfaces on each alternating stack (32, 46) may coincide with surface segments of a stepped bottom surface of a respective overlying retro-stepped dielectric material portion 65. The patterned etch mask layer may comprise additional openings in areas that overlie various nodes of the semiconductor devices 700 in the peripheral region 200.

An anisotropic etch process can be performed to transfer the pattern of the openings in the patterned etch mask layer through the contact-level dielectric layer 73 and the retro-stepped dielectric material portions 65 and through a respective underlying portion of the backside blocking dielectric layers 44. Layer-contact via cavities 85 can be formed in the contact region 300, and peripheral contact via cavities 7P can be formed in the peripheral region 200. Each layer-contact via cavity 85 vertically extends from a top surface of the contact-level dielectric layer 73 to a physically exposed top surface segment of a respective electrically conductive layer 46. Each peripheral contact via cavity 7P vertically extends from the top surface of the contact-level dielectric layer 73 to a surface of a node of a respective one of the semiconductor devices 700. The patterned etch mask layer may be subsequently removed, for example, by ashing.

In an alternative embodiment, the layer-contact via cavities 85 and/or the peripheral contact via cavities 7P may be formed during the same patterning and etching steps as the drain contact via cavities 87. In this embodiment, a single photoresist and a single etch process is used to form all of the cavities (7P, 85, 87). Thus, the etch-stop dielectric layer 85 permits formation of all of the cavities (7P, 85, 87) using the same patterning and etching steps because the relatively shallow drain contact via cavity 87 etch stops on the etch-stop dielectric layer 85, while the relatively deep via 7P and 85 etches continue to the elements (e.g., the respective devices 700 and the electrically conductive layers 46) exposed under the dielectric layer 65.

Figure 14A:
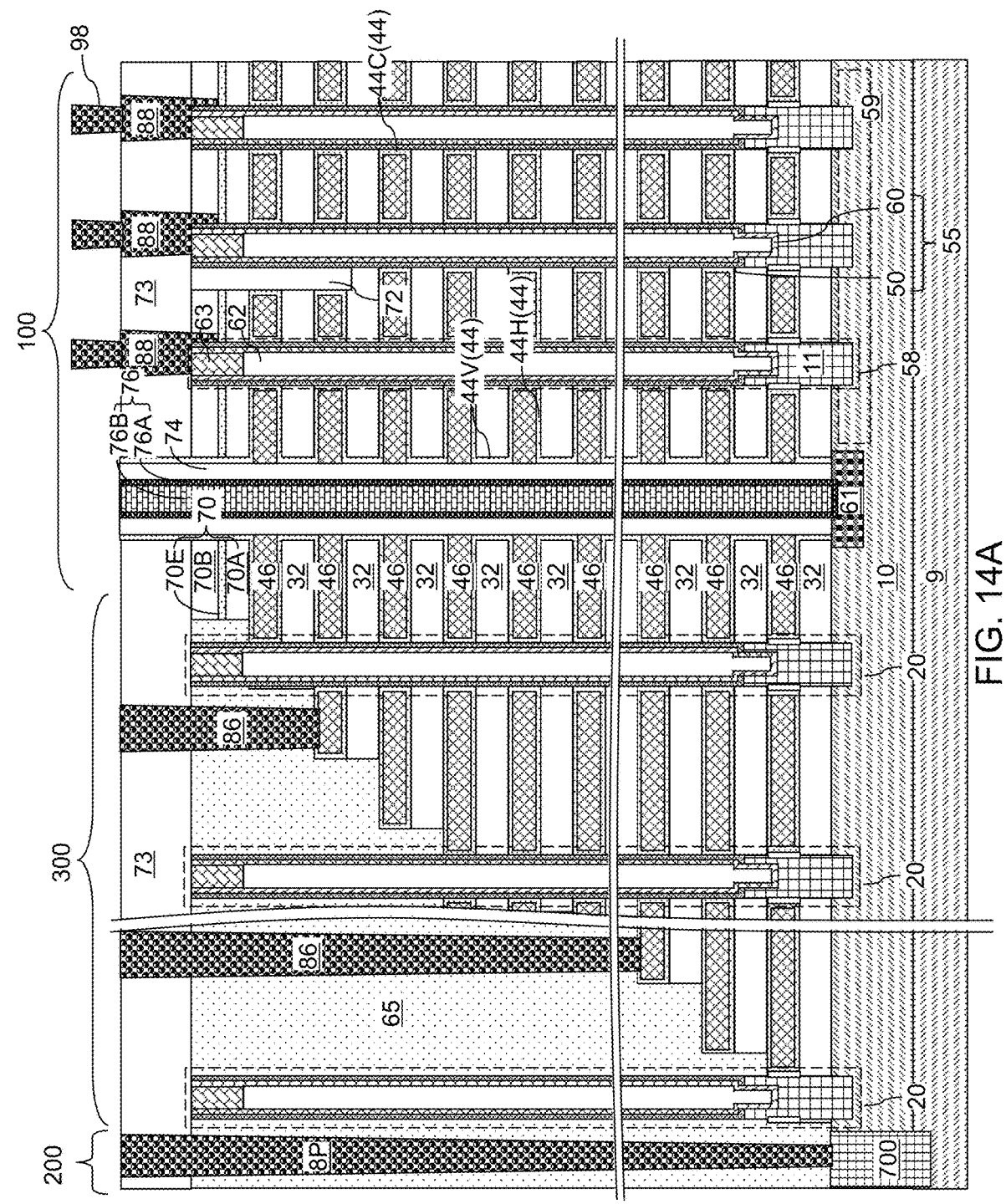
FIG. 14A is a schematic vertical cross-sectional view of the exemplary structure after formation of contact via structures according to an embodiment of the present disclosure.
Figure 14B:
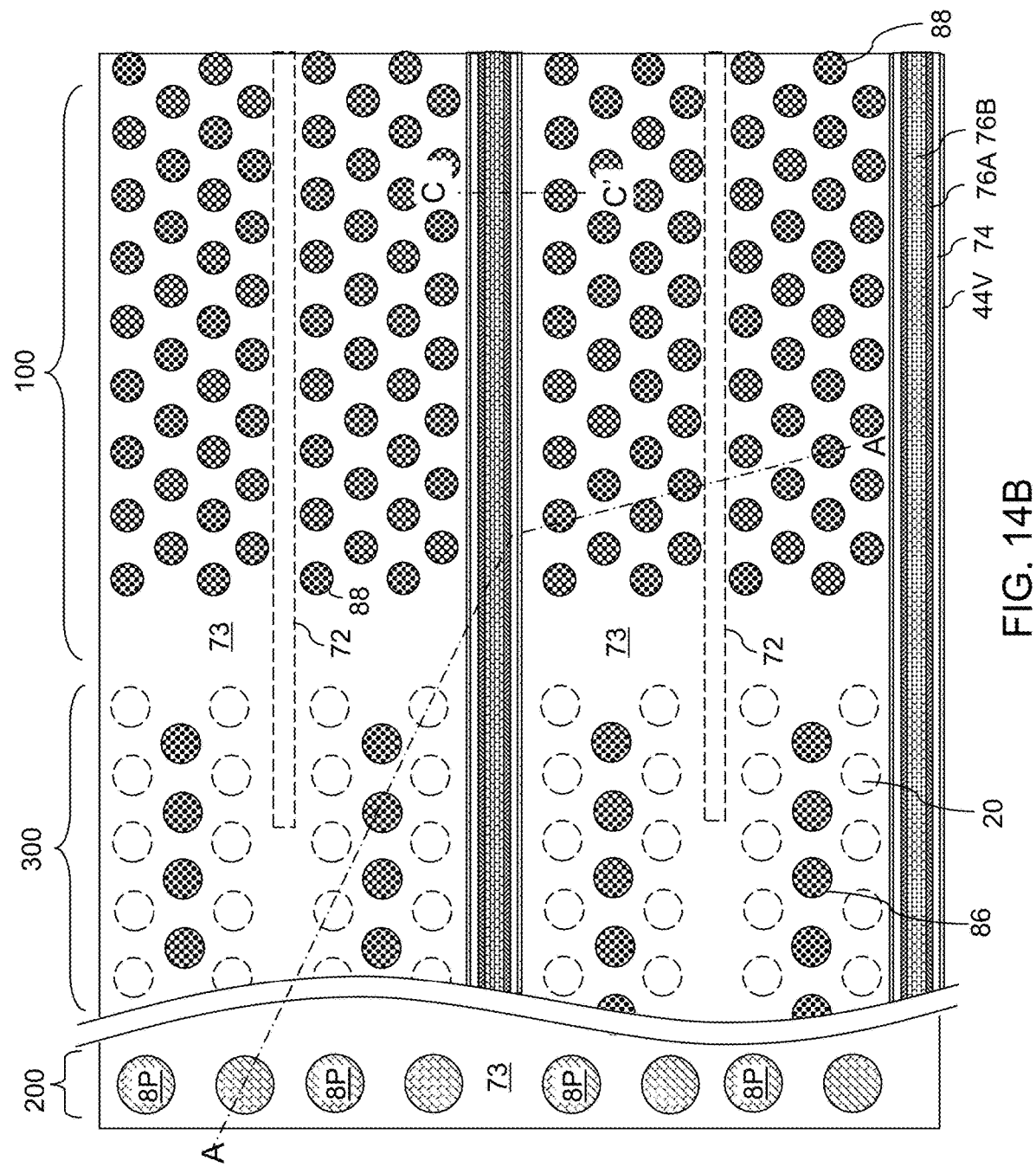
FIG. 14B is a top-down view of the exemplary structure of FIG. 14A. The vertical plane A-A' is the plane of the schematic vertical cross-sectional view of FIG. 14A.
Figure 14C:
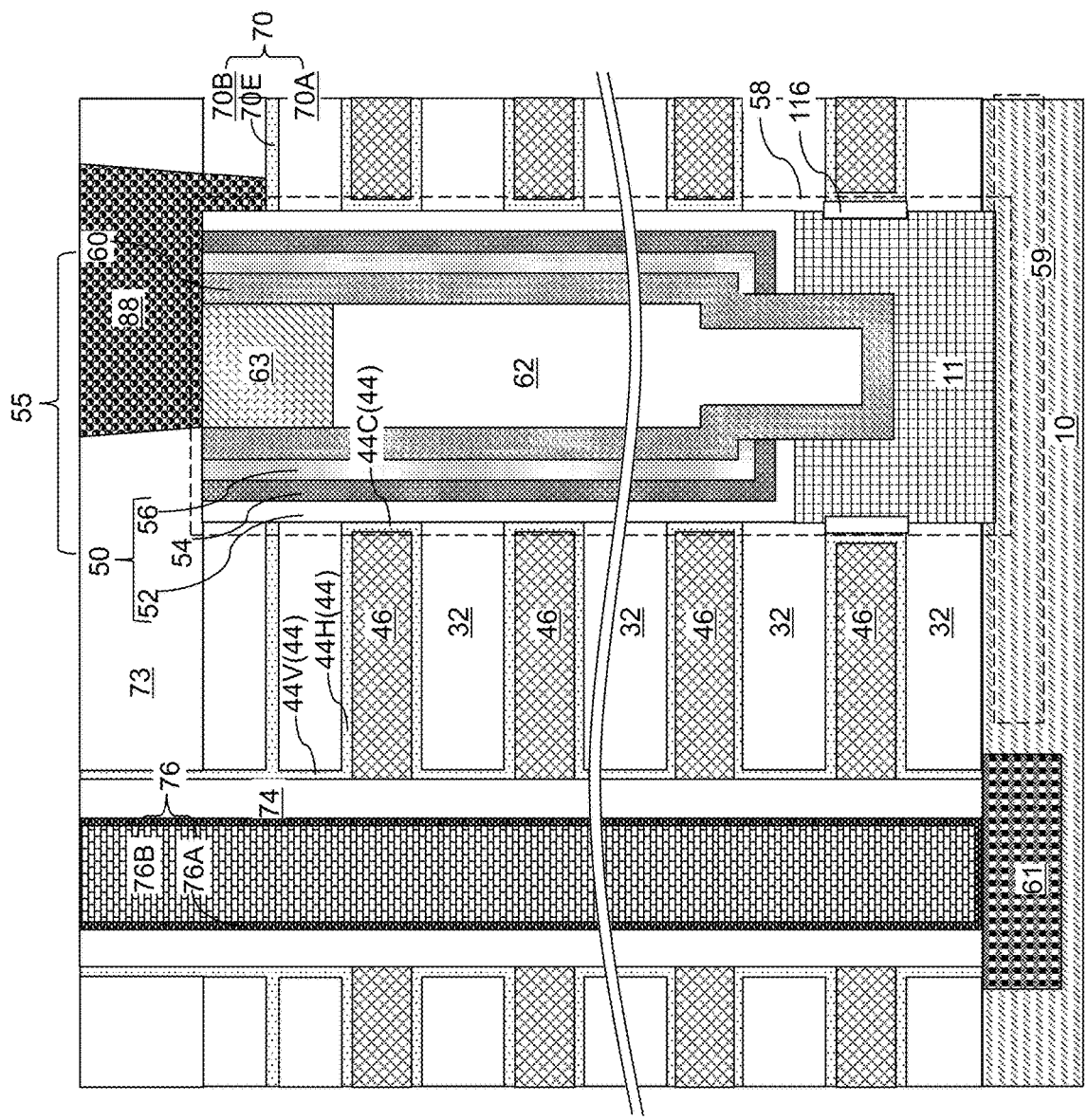
FIG. 14C is a vertical cross-sectional view of the exemplary structure along the vertical plane C-C' of FIG. 14B.

Referring to FIGS. 14A-14C, at least one metallic material can be deposited in the drain contact via cavities 87, the layer-contact via cavities 85, and the peripheral contact via cavities 7P. The at least one metallic material may comprise a metallic barrier liner material (such as a conductive metal nitride material) and a metallic fill material (such as W, Ru, Co, Mo, To, Ta, Co, etc.). Excess portions of the at least one metallic material may be removed from above the horizontal plane including the top surface of the contact-level dielectric layer 73 by performing a planarization process such as a chemical mechanical polishing process or a recess etch process. Each remaining portion of the at least one metallic material filling a respective drain contact via cavity 87 constitutes a drain contact via structure 88. Each remaining portion of the at least one metallic material filling a respective layer-contact via cavity 85 constitutes a layer-contact via structure 86. Each remaining portion of the at least one metallic material filling a respective peripheral contact via cavity 7P constitutes a peripheral contact via structure 8P. Top surfaces of the various contact via structures (88, 86, 8P) may be formed within a horizontal plane including the top surface of the contact-level dielectric layer 73

The drain contact via structures 88 vertically-extends through the contact-level dielectric layer 73 and contacts a top surface (e.g., the drain region 63) of a respective one of the memory opening fill structures 58. In one embodiment, each of the memory opening fill structures 58 comprises a vertical semiconductor channel 60 and a drain region 63 contacting a top end of the vertical semiconductor channel 60 and contacting a first bottom surface of a respective one of the drain contact via structures 88. Bit lines 98 are then formed in electrical contact with the drain contact via structures 88.

Figure 15:
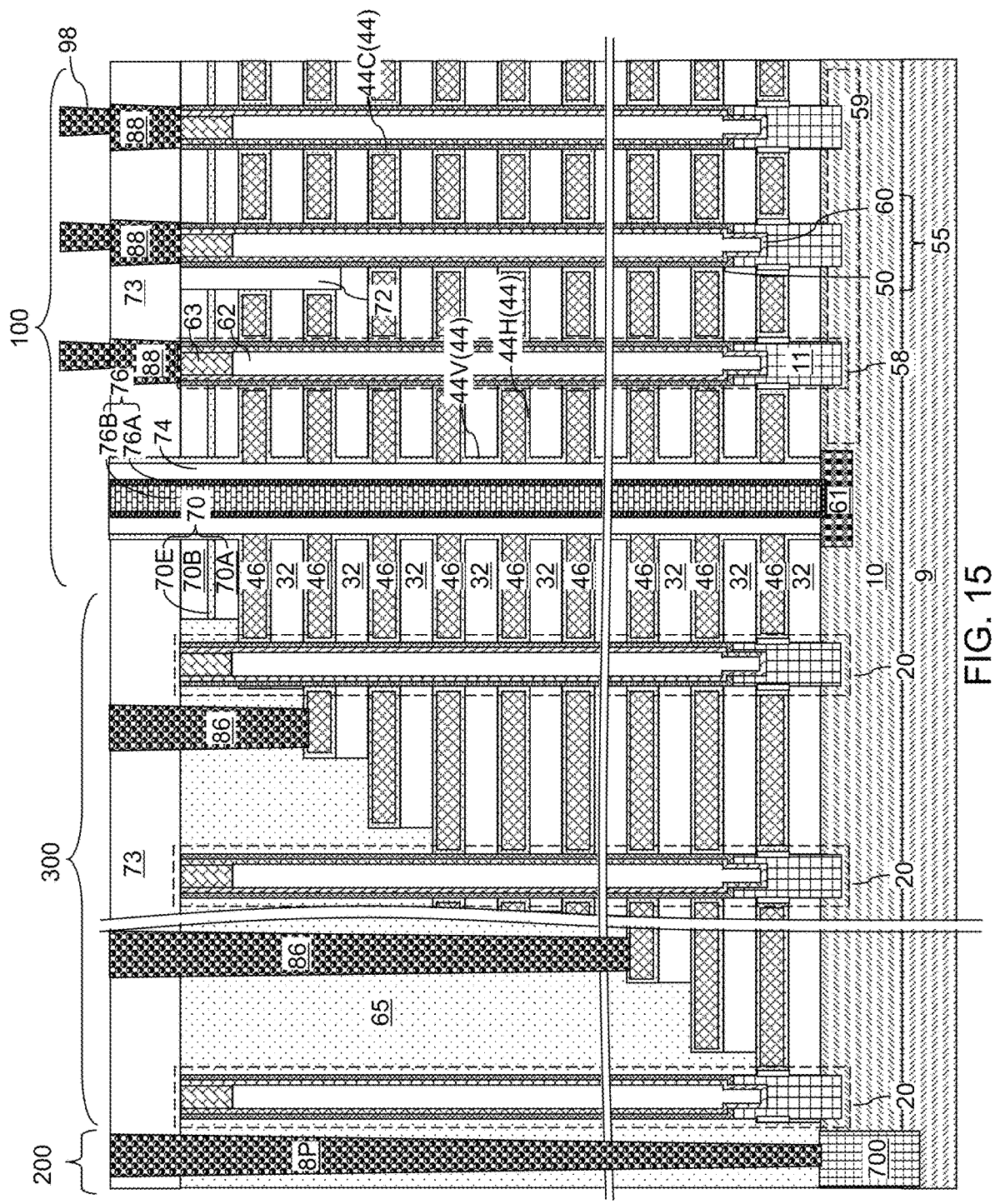
FIG. 15 is a schematic vertical cross-sectional view of an alternative embodiment of the exemplary structure in case the lithographic overlay error during patterning of the drain contact via cavities is zero according to an alternative embodiment of the present disclosure.

Referring to FIG. 15, an alternative embodiment of the exemplary structure is illustrated for a case in which the lithographic overlay error during patterning of the drain contact via cavities 87 is zero. Generally, a drain contact via structure 88 contacts a top surface of a respective drain region 63, and may or may not contact a sidewall of a memory film 50 and/or a top surface segment of an etch-stop dielectric layer 70E.

Referring to all drawings and according to various embodiments of the present disclosure, a three-dimensional memory device comprises an alternating stack (32, 46) of insulating layers 32 and electrically conductive layers 46, a composite insulating cap layer 70 located over the alternating stack, memory openings 49 vertically extending through the composite insulating cap layer 70 and the alternating stack (32, 46), and memory opening fill structures 58 located in the memory openings 49. Each of the memory opening fill structures 58 comprises a vertical semiconductor channel 60 and a vertical stack of memory elements (such as portions of a memory film 50 located at levels of the electrically conductive layers 46). The composite insulating layer 70 includes a bottom insulating cap layer 70A, a top insulating cap layer 70B, and an etch-stop dielectric layer 70E located between the bottom insulating cap layer and the top insulating cap layer.

In one embodiment, the device also includes a dielectric metal oxide material. A first portion of the dielectric metal oxide material comprises a backside blocking dielectric layer 44 which is located between each vertically neighboring pair of an insulating layer 32 and an electrically conductive layer 46 within the alternating stack (32, 46), while a second portion of the dielectric metal oxide material comprises the etch-stop dielectric layer 70E.

In one embodiment, the etch-stop dielectric layer 70E has a different thickness than the backside blocking dielectric layer 44. In one embodiment, the backside blocking dielectric layer 44 has a first thickness; and the etch-stop dielectric layer 70E has a second thickness that is greater than 50% of the first thickness and is less than twice the first thickness.

In one embodiment, the three-dimensional memory device comprises: a contact-level dielectric layer 73 overlying the composite insulating cap layer 70; and drain contact via structures 88 vertically-extending through the contact-level dielectric layer 73 and contacting a top surface of a respective one of the memory opening fill structures 58. In one embodiment, each of the memory opening fill structures 58 further comprises a drain region 63 contacting a top end of the vertical semiconductor channel 60 and contacting a first bottom surface of a respective one of the drain contact via structures 88.

In one embodiment, each of the memory opening fill structures 58 comprises a memory film 50 vertically extending through a plurality of electrically conductive layers 46 within the electrically conductive layers 46 and contacting a respective sidewall segment of the composite insulating cap layer 70; and each vertical stack of memory elements comprises portions of a respective one of the memory films 50 that are located at levels of the plurality of electrically conductive layers 46. In one embodiment, at least one of the drain contact via structures 88 contacts a top surface of a respective memory film 50 among the memory films 50.

In one embodiment, the at least one of the drain contact via structures 88 contacts a sidewall surface segment of the respective memory film 50 that is located above a horizontal plane including an interface between the etch-stop dielectric layer 70E and the top insulating cap layer 70B. In one embodiment, the at least one of the drain contact via structures 88 contacts a sidewall surface segment of the top insulating cap layer 70B and a top surface segment of the etch stop dielectric layer, and does not extend below the etch-stop dielectric layer 70E.

In one embodiment, the backside blocking dielectric layer 44 comprises a vertically-extending portion 44V that contacts a sidewall of the contact-level dielectric layer 73, a sidewall of the top insulating cap layer 70B, and a sidewall of the bottom insulating cap layer 70A, and is adjoined to the etch-stop dielectric layer 70E. In one embodiment, sidewall segments of the memory opening fill structures 58 located at levels of the electrically conductive layers 46 are laterally surrounded by and are laterally contacted by the backside blocking dielectric layer 44.

In one embodiment, the insulating layers 32, the bottom insulating cap layer 70A, and the top insulating cap layer 70B comprise silicon oxide, and the etch-stop dielectric layer 70E comprises aluminum oxide. In one embodiment, a topmost electrically conductive layer 46 in the alternating stack (32, 46) comprises a drain side select gate electrode, and the etch-stop dielectric layer 70E is located above the topmost electrically conductive layer in the alternating stack.

Various embodiments of the present disclosure provide the etch-stop dielectric layer 70E which is used to reduce or prevent electrical shorts between drain contact via structures 88 and a topmost electrically conductive layer 46 within a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers;
a composite insulating cap layer located over the alternating stack, the composite insulating cap layer comprises a bottom insulating cap layer, a top insulating cap layer, and an etch-stop dielectric layer located between the bottom insulating cap layer and the top insulating cap layer;
memory openings vertically extending through the composite insulating cap layer and the alternating stack; and
memory opening fill structures located in the memory openings, wherein each of the memory opening fill structures comprises a vertical semiconductor channel and a vertical stack of memory elements and a drain region adjoined to a top end of the vertical semiconductor channel, wherein each of the bottom insulating cap layer, the top insulating cap layer, and the etch-stop dielectric layer laterally surrounds the drain regions of the memory opening fill structures.

2. The three-dimensional memory device of claim 1, further comprising a dielectric metal oxide material, wherein:
a first portion of the dielectric metal oxide material comprises a backside blocking dielectric layer located between each vertically neighboring pair of an insulating layer and an electrically conductive layer within the alternating stack; and
a second portion of the dielectric metal oxide material comprises the etch-stop dielectric layer.

3. The three-dimensional memory device of claim 2, wherein:
the backside blocking dielectric layer has a first thickness; and
the etch-stop dielectric layer has a second thickness that is greater than 50% of the first thickness and is less than twice the first thickness.

4. The three-dimensional memory device of claim 2, further comprising:
a contact-level dielectric layer overlying the composite insulating cap layer; and
drain contact via structures vertically-extending through the contact-level dielectric layer and contacting a top surface of a respective one of the memory opening fill structures.

5. The three-dimensional memory device of claim 4, wherein each of the drain regions contacts a first bottom surface of a respective one of the drain contact via structures.

6. The three-dimensional memory device of claim 4, wherein:
each of the memory opening fill structures comprises a memory film vertically extending through a plurality of electrically conductive layers within the electrically conductive layers and contacting a respective sidewall segment of the composite insulating cap layer; and
each vertical stack of memory elements comprises portions of a respective one of the memory films that are located at levels of the plurality of electrically conductive layers.

7. The three-dimensional memory device of claim 6, wherein at least one of the drain contact via structures contacts a top surface of a respective memory film of the memory films.

8. The three-dimensional memory device of claim 7, wherein:
the at least one of the drain contact via structures contacts a sidewall surface segment of the respective memory film of the memory films that is located above a horizontal plane including an interface between the etch-stop dielectric layer and the top insulating cap layer; and
the at least one of the drain contact via structures contacts a sidewall surface segment of the top insulating cap layer and a top surface segment of the etch stop dielectric layer, and does not extend below the etch-stop dielectric layer.

9. The three-dimensional memory device of claim 4, wherein the backside blocking dielectric layer comprises a vertically-extending portion that contacts a sidewall of the contact-level dielectric layer, a sidewall of the top insulating cap layer, and a sidewall of the bottom insulating cap layer, and is adjoined to the etch-stop dielectric layer.

10. The three-dimensional memory device of claim 4, wherein sidewall segments of the memory opening fill structures located at levels of the electrically conductive layers are laterally surrounded by and are laterally contacted by the backside blocking dielectric layer.

11. The three-dimensional memory device of claim 1, wherein:
the insulating layers, the bottom insulating cap layer, and the top insulating cap layer comprise silicon oxide; and
the etch-stop dielectric layer comprises aluminum oxide.

12. The three-dimensional memory device of claim 11, wherein:
a topmost electrically conductive layer of the electrically conductive layers in the alternating stack comprises a drain side select gate electrode; and
the etch-stop dielectric layer is located above the topmost electrically conductive layer in the alternating stack.

13. The three-dimensional memory device of claim 1, further comprising a drain contact via structure contacting a top surface of the drain region of one of the memory opening fill structures and contacting a top surface segment of the etch-stop dielectric layer.

14. The three-dimensional memory device of claim 13, wherein the drain contact via structure contacts a segment of a sidewall of said one of the memory opening fill structures.

15. The three-dimensional memory device of claim 13, wherein the drain contact via structure contacts a sidewall surface of the top insulating cap layer.

16. The three-dimensional memory device of claim 13, wherein:
the vertical stack of memory elements within each of the memory opening fill structures comprises portion of a memory film that extends through the alternating stack; and
the drain contact via structure contacts a surface segment of an outer sidewall of the memory film of said one of the memory opening fill structures.

17. The three-dimensional memory device of claim 13, wherein a bottommost surface of the drain contact via structure contacts the top surface segment of the etch-stop dielectric layer.

18. The three-dimensional memory device of claim 13, further comprising a contact-level dielectric layer overlying the alternating stack, wherein a top surface of the drain contact via structure is located within a horizontal plane including a top surface of the contact-level dielectric layer, wherein a first segment of a sidewall of the drain contact via structure that overlies the drain region of said one of the memory opening fill structures has a lesser vertical extent than a second segment of the sidewall of the drain contact via structure that does not have an areal overlap with said one of the memory opening fill structures in a plan view.

19. The three-dimensional memory device of claim 1, wherein the etch-stop dielectric layer is located entirely between a first horizontal plane including top surfaces of the drain regions and a second horizontal plane including bottom surfaces of the drain regions.

20. The three-dimensional memory device of claim 19, wherein a top surface of the top insulating cap layer and top surfaces of the memory opening fill structures are located within the first horizontal plane.

* * * * *